(12) United States Patent
Lee et al.

(10) Patent No.: US 11,162,991 B2
(45) Date of Patent: Nov. 2, 2021

(54) ELECTRONIC DEVICE AND METHOD BY WHICH ELECTRONIC DEVICE RECOGNIZES CONNECTION TERMINAL OF EXTERNAL DEVICE

(71) Applicant: Samsung Electronics Co., Ltd., Suwon-si, Gyeonggi-do (KR)

(72) Inventors: Jaehwan Lee, Anyang-si (KR); Hoyeong Lim, Suwon-si (KR); Kihyun Park, Yongin-si (KR); Gihoon Lee, Hwaseong-si (KR); Duhyun Kim, Yongin-si (KR); Yongseung Yi, Seoul (KR); Dongil Son, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/393,460

(22) Filed: Apr. 24, 2019

(65) Prior Publication Data

US 2019/0257869 A1    Aug. 22, 2019

Related U.S. Application Data

(63) Continuation of application No. PCT/KR2017/011632, filed on Oct. 20, 2017.

(30) Foreign Application Priority Data

Oct. 25, 2016 (KR) .................. 10-2016-0139486

(51) Int. Cl.
*G01R 27/26* (2006.01)
*H01R 9/24* (2006.01)
(Continued)

(52) U.S. Cl.
CPC .............. *G01R 27/26* (2013.01); *H01R 9/24* (2013.01); *H01R 9/2425* (2013.01);
(Continued)

(58) Field of Classification Search
CPC ........... G01R 27/26; H04M 1/02; H01R 9/26; H01R 9/24
See application file for complete search history.

(56) References Cited

U.S. PATENT DOCUMENTS 7,699,663 B1    4/2010   Little et al.
8,064,593 B1    11/2011  Dobie
(Continued)

FOREIGN PATENT DOCUMENTS

CN    201319596 Y    9/2009
CN    101601001 A    12/2009
(Continued)

OTHER PUBLICATIONS

Chinese Office Action dated Jan. 30, 2019, issued in a counterpart Chinese application No. 201610392676.9.
(Continued)

*Primary Examiner* — Henry Tsai
*Assistant Examiner* — Christopher A Daley
(74) *Attorney, Agent, or Firm* — Jefferson IP Law, LLP

(57) ABSTRACT

An electronic device is provided including a connector comprising a plurality of terminals, the connector being configured to be connected with an external device; a circuit electrically connected to at least a subset of the plurality of terminals; and a processor electrically connected to the circuit, wherein the processor is configured to detect a connection of the external device through the connector, detect a first impedance of a first electrical path including a first terminal of the plurality of terminals, detect a second impedance of a second electrical path including a second terminal of the plurality of terminals, and determine a connection direction of the external device connected through the connector, based on the first impedance and the second impedance.

11 Claims, 17 Drawing Sheets

(51) Int. Cl.
*H01R 9/26* (2006.01)
*H04M 1/02* (2006.01)

(52) U.S. Cl.
CPC ............ *H01R 9/2658* (2013.01); *H04M 1/02* (2013.01); *H04M 1/0274* (2013.01)

(56) References Cited

U.S. PATENT DOCUMENTS

| | | | |
|---|---|---|---|
| 8,064,613 | B1 | 11/2011 | Helfrich |
| 9,223,727 | B2* | 12/2015 | Wada ..................... G06F 13/00 |
| 10,261,934 | B2 | 4/2019 | Lim |
| 10,277,972 | B2 | 4/2019 | Liu et al. |
| 2004/0064273 | A1 | 4/2004 | Le et al. |
| 2006/0080476 | A1 | 4/2006 | Wang et al. |
| 2007/0232098 | A1 | 10/2007 | Danner |
| 2010/0109749 | A1* | 5/2010 | Chen et al. ........... G06F 13/385 327/419 |
| 2010/0109795 | A1 | 5/2010 | Jones et al. |
| 2010/0169534 | A1 | 7/2010 | Saarinen et al. |
| 2011/0191814 | A1 | 8/2011 | Kobayashi |
| 2011/0219272 | A1 | 9/2011 | Lai et al. |
| 2012/0200172 | A1* | 8/2012 | Johnson ................ H04R 29/001 307/116 |
| 2012/0290761 | A1 | 11/2012 | Chen et al. |
| 2013/0084725 | A1 | 4/2013 | Liao et al. |
| 2013/0323951 | A1 | 12/2013 | Yu et al. |
| 2014/0057495 | A1 | 2/2014 | Liao et al. |
| 2014/0073188 | A1 | 3/2014 | Fritchman et al. |
| 2014/0075069 | A1 | 3/2014 | Mullins et al. |
| 2014/0354080 | A1 | 12/2014 | Sung et al. |
| 2014/0354663 | A1* | 12/2014 | Takahashi ............. G06F 3/0484 345/530 |
| 2015/0031223 | A1 | 1/2015 | Liao |
| 2015/0106544 | A1 | 4/2015 | Leinonen et al. |
| 2015/0186320 | A1 | 7/2015 | Jaussi et al. |
| 2015/0269102 | A1 | 9/2015 | Inha et al. |
| 2015/0296645 | A1 | 10/2015 | Sam et al. |
| 2015/0363339 | A1 | 12/2015 | Huang et al. |
| 2015/0377810 | A1 | 12/2015 | Roh et al. |
| 2016/0093994 | A1 | 3/2016 | Chen et al. |
| 2016/0099712 | A1* | 4/2016 | Cui ......................... G06F 3/002 327/109 |
| 2016/0142810 | A1* | 5/2016 | Freitas ................. H04R 1/1041 381/74 |
| 2016/0156137 | A1 | 6/2016 | Pan et al. |
| 2016/0190794 | A1* | 6/2016 | Forghani-Zadeh ...... H02H 7/20 361/86 |
| 2016/0239075 | A1 | 8/2016 | Miyaoka et al. |
| 2016/0246747 | A1 | 8/2016 | Rand et al. |
| 2016/0259005 | A1 | 9/2016 | Menon et al. |
| 2016/0323435 | A1 | 11/2016 | Antonopoulus et al. |
| 2016/0335221 | A1 | 11/2016 | Zhu et al. |
| 2017/0040026 | A1* | 2/2017 | Kuo ..................... G10L 21/0208 |
| 2017/0040761 | A1 | 2/2017 | Tsai |
| 2018/0004696 | A1 | 1/2018 | Lee et al. |
| 2018/0027330 | A1 | 1/2018 | Rand et al. |

FOREIGN PATENT DOCUMENTS

| | | |
|---|---|---|
| CN | 101882736 A | 11/2010 |
| CN | 102203851 A | 9/2011 |
| CN | 203135171 U | 8/2013 |
| CN | 204179445 U | 2/2015 |
| EP | 3 370 434 B1 | 3/2020 |
| KR | 10-2006-0062423 A | 6/2006 |
| KR | 10-2006-0068603 A | 6/2006 |
| KR | 10-2016-0001438 A | 1/2016 |
| KR | 10-2016-0145414 A | 12/2016 |
| KR | 10-2018-0002462 A | 1/2018 |

OTHER PUBLICATIONS

Extended European Search Report dated May 19, 2020, issued in European Patent Application No. 17865568.4.
Indonesian Office Action dated Jul. 27, 2021, issued in Indonesian Patent Application No. P00201903468.

* cited by examiner

ELECTRONIC DEVICE AND METHOD BY WHICH ELECTRONIC DEVICE RECOGNIZES CONNECTION TERMINAL OF EXTERNAL DEVICE

CROSS-REFERENCE TO RELATED APPLICATION(S)

This application is a continuation application of International application No. PCT/KR2017/011632, filed on Oct. 20, 2017, which was based on and claimed the benefit of a Korean patent application number 10-2016-0139486, filed on Oct. 25, 2016, in the Korean Intellectual Property Office, the disclosure of each of which is incorporated by reference herein in its entirety.

TECHNICAL FIELD

Embodiments relate to an electronic device, for example, to an electronic device connected to an external device through a connector to provide an audio signal, and a method for the electronic device to recognize a connection terminal of the external device.

BACKGROUND ART

With the growth of mobile communication technologies and processor technologies, portable end-user devices are evolving to meet user's needs for new and various functions. Such a portable end-user device (hereinafter referred to as an electronic device) provides various types of video and audio multimedia functions in addition to inherent communication functions such as voice call and message transmission/reception. For this, the electronic device has a connector to which an external device can be connected, and the connector is standardized by various standard schemes.

A universal serial bus (USB) is an input/output standard scheme widely used for connection between an electronic device and an external device. For example, an electronic device and an external audio device (e.g., an earphone, a headphone, a speaker, etc.) may be connected using this USB scheme. In this case, the electronic device and the external audio device are electrically connected through terminals of each connector. In particular, as in a typical four-pole earphone, left sound (L), right sound (R), microphone (Mic), and ground (GND) terminals need to be connected. That is, for transmission of audio signals between the electronic device and the external device, it is important to define functions of respective terminals of the connector.

DISCLOSURE OF INVENTION

Technical Problem

When the connectors of the electronic device and the external device are formed to be physically connectable in multiple directions, electrical connection between terminals may be established differently depending on the connected direction. That is, depending on the direction in which the connector of the external device is connected, the terminal of the external device electrically connected to the specific terminal of the electronic device may be changed.

In a connector structure that allows connection in multiple directions, a typical electronic device cannot distinguish the types of terminals, especially, ground and microphone terminals, of an external device connected to terminals thereof.

Solution to Problem

An electronic device according to various embodiments of the disclosure includes a connector including a plurality of terminals; a circuit electrically connected to at least parts of the plurality of terminals; and a processor electrically connected to the circuit. The processor may be configured to detect a connection direction of an external device connected through the connector, based on an electrical signal inputted through at least one terminal among the plurality of terminals of the connector, and to supply a microphone bias voltage to at least one, electrically connected to a microphone terminal of the external device, of first and second terminals of the connector, based on the detected direction of the external device.

A method according to various embodiments of the disclosure, performed by an electronic device, for recognizing a connection terminal of an external device may include operations of detecting a connection of the external device connected through a connector including a plurality of terminals; detecting a connection direction of the external device connected through the connector, based on an electrical signal inputted through at least one terminal among the plurality of terminals of the connector; and supplying a microphone bias voltage to at least one, electrically connected to a microphone terminal of the external device, of first and second terminals of the connector, based on the detected direction of the external device.

Advantageous Effects of Invention

According to various embodiments of the disclosure, it is possible to provide an electronic device capable of clearly recognizing terminals of an external device connected to respective terminals of a connector of the electronic device and therefore transmitting or receiving an audio signal, and also provide a method of the electronic device for recognizing a connection terminal of the external device.

MODE FOR THE INVENTION

Figure 1:
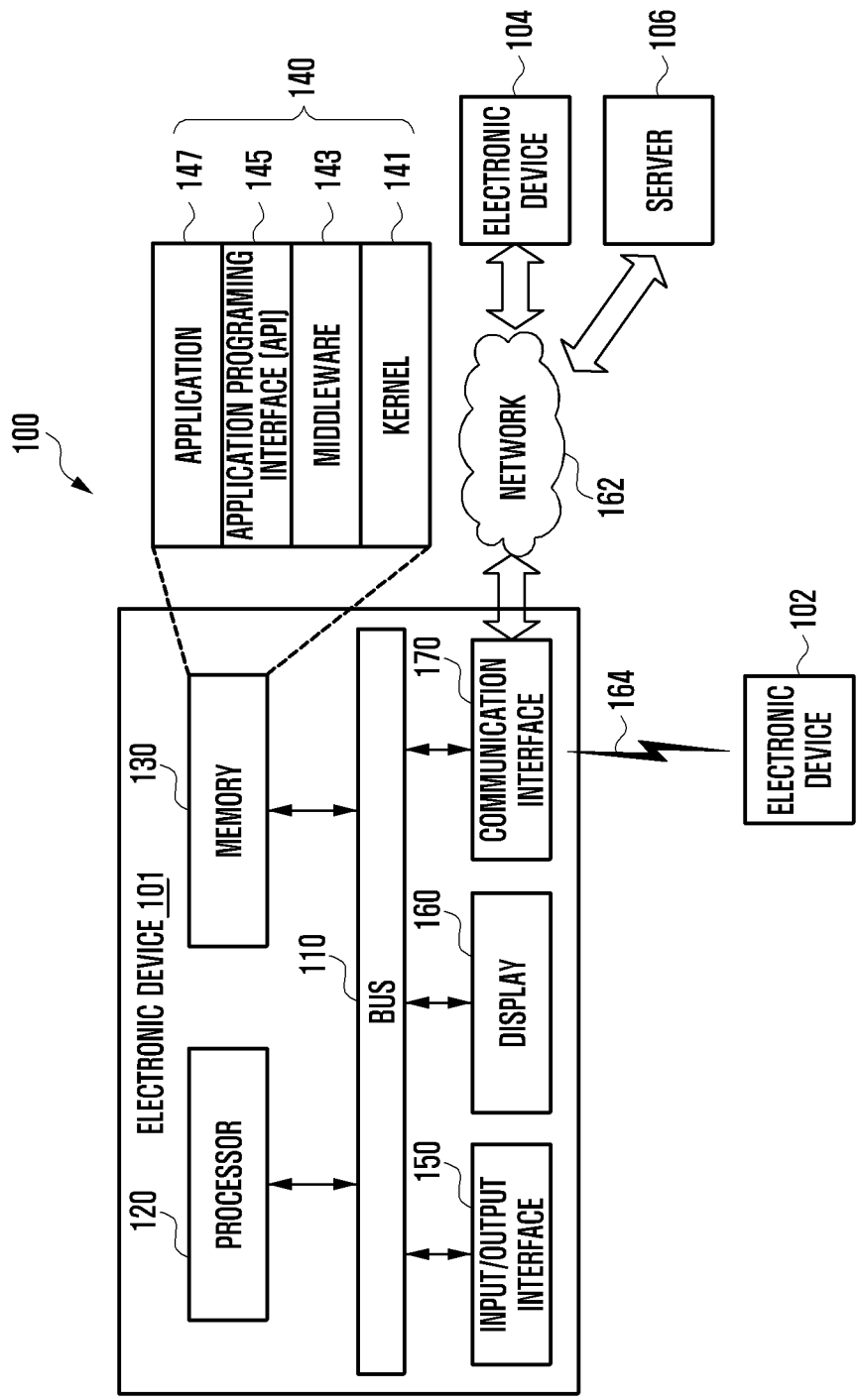
FIG. 1 illustrates an electronic device in a network environment according to various embodiments.

Hereinafter, various embodiments of the present disclosure are described in detail with reference to accompanying drawings. The embodiments and terms used herein are not intended to limit the technology disclosed in specific forms and should be understood to include various modifications, equivalents, and/or alternatives to corresponding embodiments. In the drawings, similar reference numbers are used to indicate similar constituent elements. As used herein, singular forms are intended to include the plural forms as well, unless the context clearly indicates otherwise. In the present disclosure, the expression "A or B" or "at least one of A and/or B" is intended to include any possible combination of enumerated items. In the present disclosure, expressions such as "1st" or "first", "2nd" or "second", etc. may modify various components regardless of the order and/or the importance but do not limit corresponding components. When it is mentioned that a (first) component is "connected" to or "accessed" by another (second) component, it may be understood that the component is directly connected to or accessed by the other component or that still other (third) component is interposed between the two components.

In the present disclosure, the expression "configured to ~" may be interchangeably used with the expressions "suitable for ~", "having a capability of ~", "changed to ~", "made to ~", "capable of ~", and "designed for" in hardware or software. The expression "device configured to ~" may denote that the device is "capable of ~" with other devices or components. For example, a "processor configured to (or set to) perform A, B, and C" may mean a dedicated processor (e.g., an embedded processor) for performing a corresponding operation or a general-purpose processor (e.g., a central processing unit (CPU) or an application processor (AP)) which executes corresponding operations by executing one or more software programs which are stored in a memory device.

According to various embodiments of the present disclosure, an electronic device may include at least one of a smart phone, a tablet Personal Computer (PC), a mobile phone, a video phone, an e-book reader, a desktop PC, a laptop PC, a netbook computer, a workstation, a server, a personal digital assistant (PDA), a portable multimedia player (PMP), an MP3 player, a medical device, a camera, and a wearable device. The wearable device may include at least one of an appcessory type device (e.g. a watch, a ring, a bracelet, an anklet, a necklace, glasses, contact lens, and head-mounted-device (HMD), a textile or clothes-integrated device (e.g., electronic clothes), a body-attached device (e.g., skin pad and tattoo), and a bio-implemented circuit. According to various embodiments, the electronic device may include at least one of television (TV), a digital video disk (DVD) player, an audio player, an air conditioner, a cleaner, an oven, a microwave oven, a washing machine, an air cleaner, a set-top box, a home automation control panel, a security control panel, a media box (for example, Samsung HomeSync™, Apple TV™, or Google TV™), game consoles (for example, Xbox™, PlayStation™), an electronic dictionary, an electronic key, a camcorder, and an electronic frame.

According to an alternative embodiment, the electronic device may include at least one of a medical device (such as portable medical measuring devices (including a glucometer, a heart rate monitor, a blood pressure monitor, and a body temperature thermometer), a magnetic resonance angiography (MRA) device, a magnetic resonance imaging (MRI) device, a computed tomography (CT) device, a camcorder, and a microwave scanner), a navigation device, a global navigation satellite system (GNSS), an event data recorder (EDR), a flight data recorder (FDR), an automotive infotainment device, marine electronic equipment (such as marine navigation system and gyro compass), aviation electronics (avionics), security equipment, an automotive head unit, an industrial or household robot, a drone, an automatic teller machine (ATM), a point of sales (POS) terminal, and an Internet-of-things (IoT) device (such as electric bulb, sensor, sprinkler system, fire alarm system, temperature controller, street lamp, toaster, fitness equipment, hot water tank, heater, and boiler). According to an embodiment of the present disclosure, the electronic device may include at least one of furniture, a part of a building/structure, a part of a vehicle, an electronic board, an electronic signature receiving device, a projector, and a sensor (such as water, electricity, gas, and electric wave meters). According to various embodiments of the present disclosure, the electronic device may be flexible or a combination of at least two of the aforementioned devices. According to an embodiment of the present disclosure, the electronic device is not limited to the aforementioned devices. In the present disclosure, the term "user" may denote a person who uses the electronic device or a device (e.g., artificial intelligent electronic device) which uses the electronic device.

A description is made of the electronic device 101 in a network environment 100 with reference to FIG. 1. The electronic device 101 may include a bus 110, a processor 120, a memory 130, an input/output interface 150, a display 160, and a communication interface 170. In an embodiment, the electronic device 101 may be configured without at least one of the aforementioned components or with another component. The bus 110 may include a circuit for interconnecting components 110 to 170 such that the components communicate signal (e.g., control message and data). The processor 120 may include at least one of a central processing device, an application processor, and a communication processor (CP). The processor 120 may execute operation related to the control of and/or communication among the other components constituting the electronic device 101 and perform data processing.

The memory 130 may include a volatile and/or non-volatile memory. The memory 130 may store a command or data associated with at least one of the components of the electronic device 101. According to an embodiment, the memory 130 may store software and/or programs 140. The programs 140 may include a kernel 141, a middleware 143, an application programming interface (API) 145, and/or an application program (or "application") 147. At least part of the kernel 141, middleware, and API 145 may be referred to as operating system. The kernel 141 may control or manage system resources (e.g., bus 110, processor 120, and memory 130) for use in executing operations or functions implemented in other programming modules (e.g., middleware 143, API 145, and application program 147). Further, the kernel 141 can provide an interface through which the middleware 143, the API 145, and/or the application 147 can access an individual element of the electronic device 101 and then control and/or manage system resources.

The middleware 143 may relay the data communicated between the API 145 or the application program 147 and the kernel 141. The middleware 143 may process at least one task request received from the application program 147 according to priority. For example, the middleware 143 may assign a priority to at least one of the application programs 147 for use of the system resources (e.g., the bus 110, the processor 120, and the memory 130) of the electronic device 101 and process the at least one task request according to the assigned priority. The API 145 may include an interface for controlling the functions provided by the kernel 141 and the middle 143 and includes at least one interface or function (e.g., command) for file control, window control, and video control, and text control, by way of example. The input/output interface 150 may relay a command or data input by a user or via an external electronic device to other component(s) of the electronic device 101 and output a command or data received from other component(s) of the electronic device 101 to the user or the external electronic device.

Examples of the display 160 may include a liquid crystal display (LCD), a light emitting diodes display (LED), a organic LED (OLED) display, a micro electro mechanical systems (MEMS) display, and an electronic paper display. The display 160 may display various contents (e.g., text, image, video, icon, and symbol) to the user by way of example. The display 160 may include a touch screen that is capable of receiving a touch, gesture, proximity, or hovering input made with an electronic pen or part of the user's body by way of example. The communication interface 170 may set up a communication channel between the electronic device 101 and an external device (e.g., first external electronic device 102, second external electronic device 104, and server 106). For example, the communication interface 170 may connect to the network 162 through a wireless or wired communication channel to communicate with the external electronic device (e.g., second external electronic device 104 and server 106).

Examples of the wireless communication may include cellular communications using at least one of LTE, LTE Advanced (LTE-A), code division multiple access (CDMA), wideband CDMA (WCDMA), universal mobile telecommunications system (UNITS), Wireless Broadband (WiBro), and global system for mobile communications (GSM). According to an embodiment, examples of the wireless communication may include communications using at least one of wireless fidelity (Wi-Fi), Bluetooth, Bluetooth low energy (BLE), Zigbee, near field communication (NFC), magnetic secure transmission, radio frequency (RF), and body area network (BAN). According to an embodiment, examples of the wireless communication may include GNSS communication. Examples of the GNSS may include a global positioning system (GPS), a global navigation satellite system (Glonass), a Beidou navigation satellite system (hereinafter, referred to as "Beidou"), and Galileo (the European global satellite-based navigation system). In the following description, the terms "GPS" and "GNSS" are interchangeably used. Examples of the wired communication may include communications using at least one of universal serial bus (USB), high definition multimedia interface (HDMI), recommended standard 233 (RS-232), power line communication, and plain old telephone service (POTS). The network 162 may be a telecommunication network including a computer network (e.g., LAN and WAN), Internet, and telephony network, by way of example.

Each of the first and second external electronic devices 102 and 104 may be identical to or different from the electronic device 101 in type. According to various embodiments, all or part of the operations being executed at the electronic device 101 may be executed at one or more other electronic devices (e.g., electronic devices 102 and 104 and server 106). According to an embodiment, if it is necessary for the electronic device 101 to execute a function or service automatically or in response to a request, the electronic device 101 may request to another device (e.g., electronic devices 102 and 104 and server 106) for executing at least part of related functions on its behalf or additionally. The other electronic device (e.g., electronic devices 102 and 104 and server 106) may execute the requested function or additional function and notify the electronic device 101 of the execution result. The electronic device 101 may provide the requested function or service with execution result in itself or after performing additional processing thereon. In order to accomplish this, it may be possible to use a cloud computing, a distributed computing, or a client-server computing technology.

Figure 2:
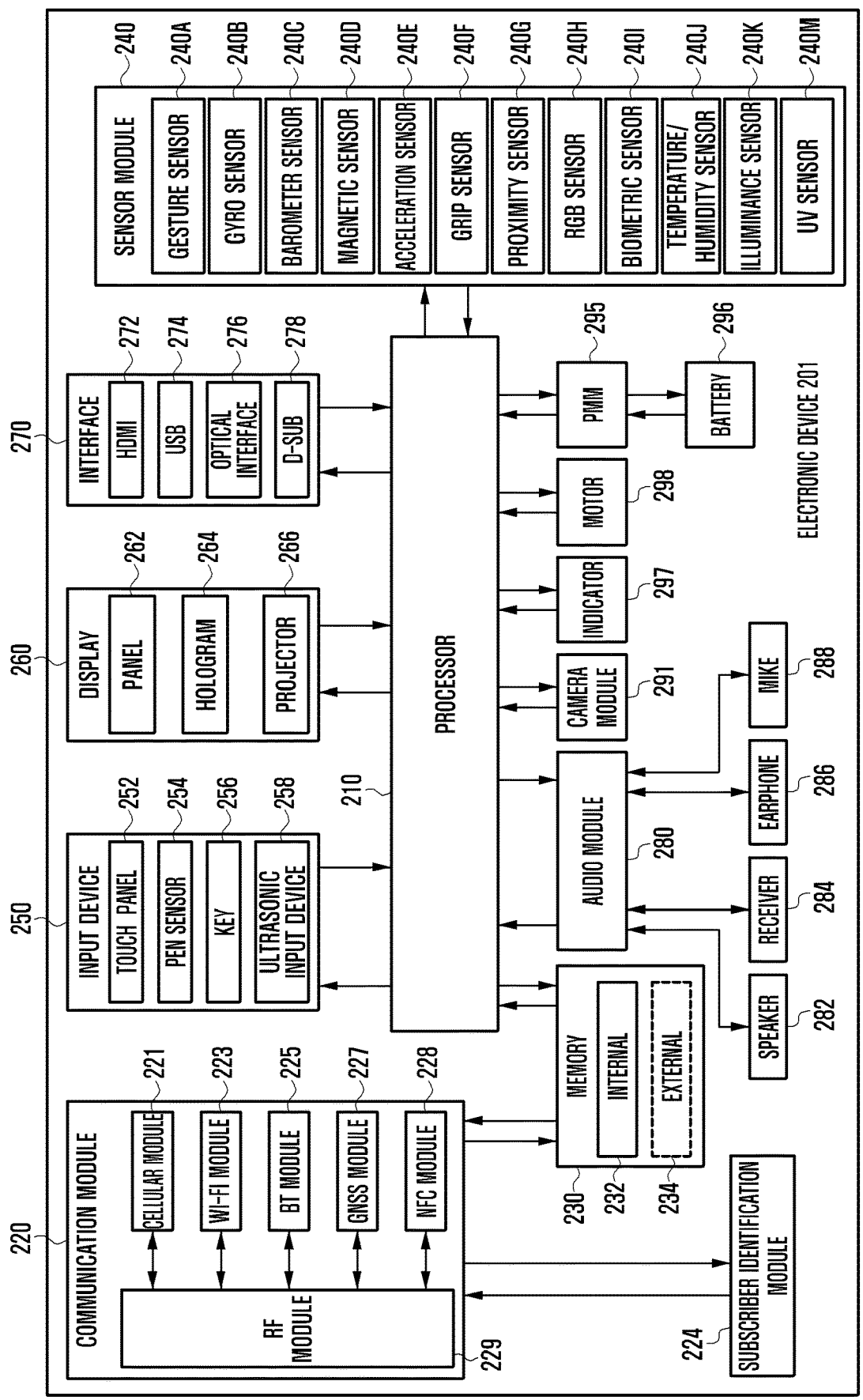
FIG. 2 is a block diagram illustrating an electronic device according to various embodiments.

FIG. 2 is a block diagram illustrating an electronic device 201 according to various embodiments. The electronic device 201 may include all or part of the electronic device 101 depicted in FIG. 1. The electronic device 201 may include at least one processor (e.g., AP 210), a communication module 220, a subscriber identity module (SIM) 224, a memory 230, a sensor module 240, an input device 250, a display 260, an interface 270, an audio module 280, a camera module 291, a power management module 295, a battery 296, an indicator 297, and a motor 298. The processor 210 may execute the operation system or an application program to control a plurality of hardware and software components connected to the processor 210 and may perform various data processing and operations. The processor 210 may be implemented in the form of system on chip (SoC) by way of example. According to an embodiment, the processor 210 may also include a graphic processing unit (GPU) and/or an image signal processor. The processor 210 may include at least part (e.g., cellular module 221) of the components depicted in FIG. 2). The processor 210 may load the command or data received from at least one of other components (e.g., non-volatile memory) onto the volatile memory and store processed result data in the non-volatile memory.

The communication module 220 may have a configuration identical with or similar to that of the communication interface 170 by way of example. For example, the communication module 220 may include a cellular module 221, a Wi-Fi module 223, a Bluetooth module 225, a GNSS module 227, an NFC module 228, and an RF module 229. The cellular module 221 may provide a voice call service, a video call service, a text messaging service, and an Internet access service via a communication network, by way of example. According to an embodiment, the cellular module 221 may identify and authenticate the electronic device 201 and perform identification and authentication on the electronic device 201 in the communication network by means of the subscriber identity module (SIM) 224. According to an embodiment, the cellular module 221 may perform part of the functions of the processor 210. According to an embodiment, the cellular 221 may include a communication processor (CP). According to an embodiment, part of the cellular module 221, the Wi-Fi module 223, the Bluetooth module 225, the GNSS module 227, and the NFC module 228 (e.g., two or more) may be included in an integrated chip (IC) or an IC package. The RF module 229 may transmit/receive a communication signal (e.g., RF signal). The RF module 229 may include a transceiver, a power amplification module (PAM), a frequency filter, a low noise amplifier (LNA), and an antenna by way of example. According to an alternative embodiment, at least one of the cellular module 221, the Wi-Fi module 223, the Bluetooth module 225, the GNSS module 227, and the NFC module 228 may transmit/receive an RF signal via a separate RF module. The SIM 224 may include a card containing a subscriber identity module or an embedded SIM and contain unique identity information (e.g., integrated circuit card identifier (ICCID)) or subscriber information (e.g., international mobile subscriber identity (IMSI)).

The memory 230 (e.g., memory 130) may include an internal memory 232 and an external memory 234 by way of example. The internal memory 232 may include at least one of a volatile memory (e.g., DRAM, SRAM, and SDRAM), a non-volatile memory (e.g., one time programmable ROM (OTPROM)), PROM, EPROM, EEPROM, mask ROM, flash ROM, and flash memory, a hard drive, and a solid state drive (SSD) by way of example. The external memory 234 may include flash drive such as compact flash (CF), secure digital (SD), Micro-SD, Mini-SD, extreme digital (xD), multimedia card (MMC), and memory stick. The external electronic device 234 may be functionally or physically connected with the electronic device 201 via various interfaces.

The sensor module 240 may measure physical quantities or detects an operation state of the electronic device 201 and convert the measured or detected information to an electrical signal. The sensor module 240 may include at least one of a gesture sensor 240A, a gyro sensor 240B, a barometric pressure sensor 240C, a magnetic sensor 240D, an acceleration sensor 240E, a grip sensor 240F, a proximity sensor 240G, a color sensor 240H (e.g., a red, green, blue (RGB) sensor), a biometric sensor 240I, a temperature/humidity sensor 240J, an illumination sensor 240K, and an ultraviolet (UV) sensor 240M. Additionally or alternatively, the sensor module 240 may include an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one sensor therein. According to an embodiment, the electronic device 201 may further include another processor configured to control the sensor module 240 as part of or separated from the processor 210, and the other processor may control the sensor module 240 while the processor 210 is in a sleep state.

The input device 250 may include a touch panel 252, a (digital) pen sensor 254, a key 256, or an ultrasonic input device 258 by way of example. The touch panel 252 may use at least one of capacitive, resistive, infrared, or ultrasonic methods by way of example. The touch panel 252 may further include a control circuit. The touch panel 252 may further include a tactile layer to provide tactile response to a user. The (digital) pen sensor 254 may include a sheet for recognition as part of a touch panel or a separate sheet for recognition. The key 256 may include a physical button, an optical key, or a keypad, by way of example. The ultrasonic input device 258 may detect ultrasonic waves generated by an input tool through a microphone (e.g., the microphone 288) and ascertain data corresponding to the detected ultrasonic waves.

The display 260 (e.g., the display 160) may include a panel 262, a hologram device 264, a projector 266, and a control circuit for controlling the aforementioned components. The panel 262 may be implemented to be flexible, transparent, or wearable. The panel 262 may include a touch panel 252 and at least one module. According to an embodiment, the panel 262 may include a pressure sensor (or force sensor) that measures the intensity of touch pressure by a user. The pressure sensor may be implemented integrally with the touch panel 252, or may be implemented as at least one sensor separately from the touch panel 252. The hologram device 264 may display a stereoscopic image in the air using a light interference phenomenon. The projector 266 may display an image by projecting light on a screen. The screen may be placed inside or outside the electronic device 201 by way of example. The interface 270 may include an HDMI 272, a USB 274, an optical interface 276, or a D-subminiature (D-sub) 278 by way of example. The interface 270 may be included in the communication interface 170 shown in FIG. 1 by way of example. Additionally or alternatively, the interface 270 may include a mobile high-definition link (MHL) interface, an SD card/MMC interface, or an infrared data association (IrDA) standard interface.

The audio module 280 may convert sounds into electrical signals and convert electrical signals into sounds. At least some components of the audio module 280 may be included in the input/output interface 145 shown in FIG. 1 by way of example. The audio module 280 may process sound information inputted/outputted through a speaker 282, a receiver 284, an earphone 286, or a microphone 288. The camera module 291, as a device for capturing a still image and a video image, may include at least one image sensor (e.g., a front sensor or a rear sensor), a lens, an image signal processor (ISP), or a flash (e.g., an LED or a xenon lamp). The power management module 295 may manage the power of the electronic device 201. The power management module 295 may include a power management IC (PMIC), a charger IC, or a battery or fuel gauge. The PMIC may support wired and/or wireless charging methods. Examples of the wireless charging method may include a magnetic resonance method, a magnetic induction method, and an electromagnetic method, and the PMIC may further include supplementary circuit such as a coil loop, a resonant circuit, and a rectifier. The battery gauge may measure a remaining capacity of the battery 296, charging voltage and current, and temperature of the battery by way of example. The battery 296 may include a rechargeable battery and/or a solar battery by way of example.

The indicator 297 may display a specific state of the electronic device 201 or part thereof (e.g., the processor 210), such as a booting state, a message state, or a charging state. The motor 298 may convert electrical signals into mechanical vibration and may generate vibration or haptic effect. The electronic device 201 may include a mobile TV-support device (e.g., a GPU) for processing media data generated in compliance with the standards such as digital multimedia broadcasting (DMB), digital video broadcasting (DVB), and mediaFlo™. Each of the above-mentioned components may be configured with at least one component and the name of a corresponding component may vary according to the type of an electronic device. According to various embodiments, the electronic device (e.g., electronic device 201) may be configured without part of the aforementioned components or with additional components; part of the components may be combined into one entity capable of executing the same functions of the components before being combined.

The term "module" used in this disclosure may mean a unit including, for example, one or a combination of hardware, software, and firmware. The term "module" may be interchangeably used with other terms, for example, such as unit, logic, logical block, component, or circuit. The "module" may be the minimum unit, or a part thereof, of an integrally constructed component. The "module" may be the minimum unit, or a part thereof, for performing one or more functions. The "module" may be implemented mechanically or electronically. For example, according to the present disclosure, the "module" may include at least one of an application-specific integrated circuit (ASIC) chip, field-programmable gate arrays (FPGAs), and a programmable-logic device, which are known or to be developed later and perform particular functions. According to various embodiments, at least a part of the device (e.g., modules or functions thereof) or the method (e.g., operations) may be implemented as instructions stored in a non-transitory computer-readable storage medium (e.g., the memory 130) in a programming module form. When the instructions are executed by a processor (e.g., 120), the processor may perform a function corresponding to the instructions. The non-transitory computer-readable recording medium may include magnetic media such as a hard disk, a floppy disk, and a magnetic tape, optical media such as a CD-ROM and a DVD, magneto-optical media such as a floptical disk, and hardware devices specially configured to store and perform a program instruction. In addition, the program instructions may include high class language codes, which can be executed in a computer by using an interpreter, as well as machine codes made by a compiler. A module or programming module according to various embodiments may include or exclude at least one of the above-discussed components or further include any other component. The operations performed by the module, programming module, or any other component according to various embodiments may be executed sequentially, in parallel, repeatedly, or by a heuristic method. Additionally, some operations may be executed in different orders or omitted, or any other operation may be added.

Figure 3:
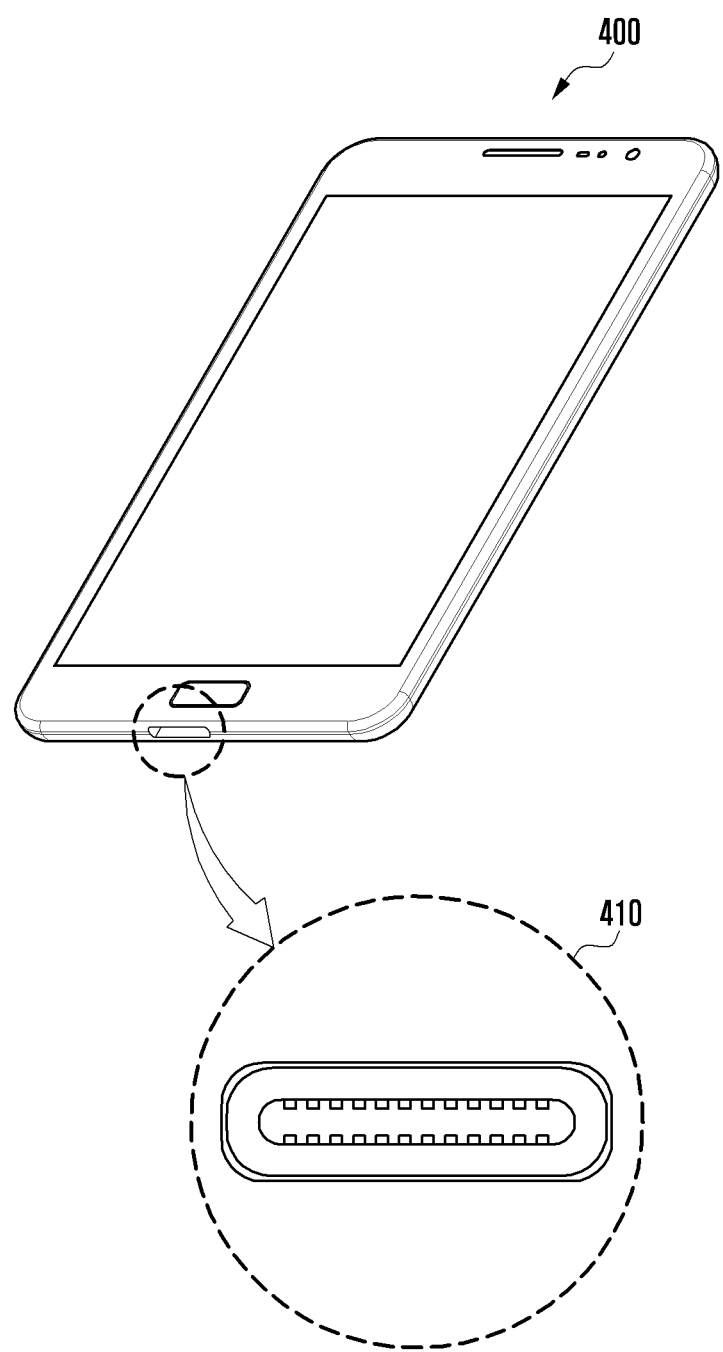
FIGS. 3 and 4 illustrate a connector of an electronic device and a connector of an external device according to various embodiments.
Figure 4:
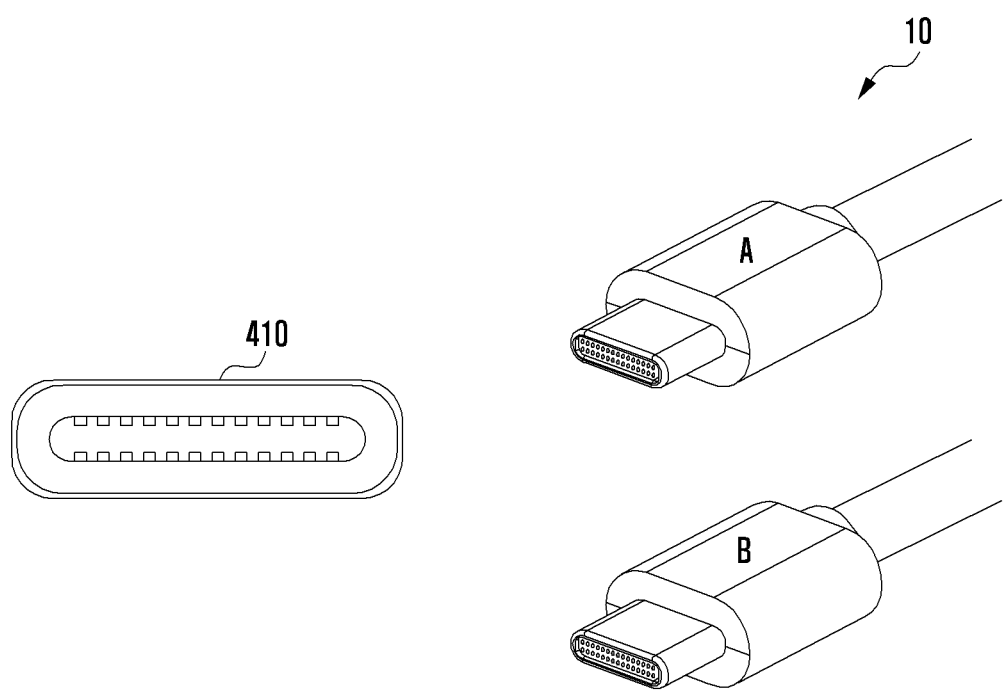

FIGS. 3 and 4 illustrate a connector of an electronic device and a connector of an external device according to various embodiments.

According to various embodiments, an electronic device 400 may be implemented as a portable electronic device such as, but not limited to, a smart phone or a tablet PC. The electronic device 400 may be any kind of electronic device that includes a connector (e.g., 410) to which the external device 10 can be connected, and is capable of transmitting and receiving data (e.g., multimedia data such as audio data, other control commands) to and from the external device 10 connected through the connector.

According to various embodiments, the electronic device 400 includes an opening formed in one side of a housing and a hole connected to the opening, and the connector 410 may be disposed within the hole. As showing in FIG. 3, the opening and the hole may be formed in a lower side of the housing of the electronic device 400, and the connector 410 may be disposed therein. However, the position of the connector 410 is not limited, and the connector 410 may be alternatively disposed in any other side of the housing of the electronic device 400.

A connector of the external device 10 may be inserted into the connector 410 of the electronic device 400. Although the type of the external device 10 is not limited, an audio accessory such as an earphone, a headphone, or a speaker will be described hereinafter as an example of the external device 10.

The connector of the external device 10 may be accommodated through the hole, physically contacted with the connector 410 of the electronic device 400, and electrically connected through physical contact. According to various embodiments, the structure of the connector 410 and the hole of the electronic device 400 may be of a reversible structure. That is, the connector 410 may be symmetrical with respect to a first direction perpendicular to an insertion direction of the external device 10 (e.g., an upward direction from a lower side of the electronic device 400) and a second direction opposite to the first direction.

Referring to FIG. 4, the connector of the external device 10 may be inserted into the connector 410 of the electronic device 400 in a direction where one surface (e.g., surface A) of the connector of the external device 10 faces a front surface (e.g., a surface where a display is located) of the electronic device 400, or in a direction where the other surface (e.g., surface B) of the connector of the external device 10 faces to the front surface of the electronic device 400.

The connector 410 includes a plurality of terminals. When the connector of the external device 10 is inserted in different directions, the terminals of the external device 10 electrically connected to the terminals of the connector 400 of the electronic device 400 may be different. For example, when the external device 10 is inserted in a first direction, a first terminal of the connector 410 is electrically connected to a terminal A (or the microphone terminal) of the external device 10. In contrast, when the external device 10 is inserted in a second direction, the first terminal of the connector 410 may be electrically connected to a terminal B (or the ground terminal) of the external device 10.

According to various embodiments, the connector 410 may be a connector based on a universal serial bus (USB) standard, especially, a connector of a USB type C standard. However, various embodiments of the disclosure are not limited to the USB type C, and may be applied to a variety of standardized or non-standardized wired interfaces such as high definition multimedia interface (HDMI), recommended standard 232 (RS-232), power line communication, or plain old telephone service (POTS).

Figure 5:
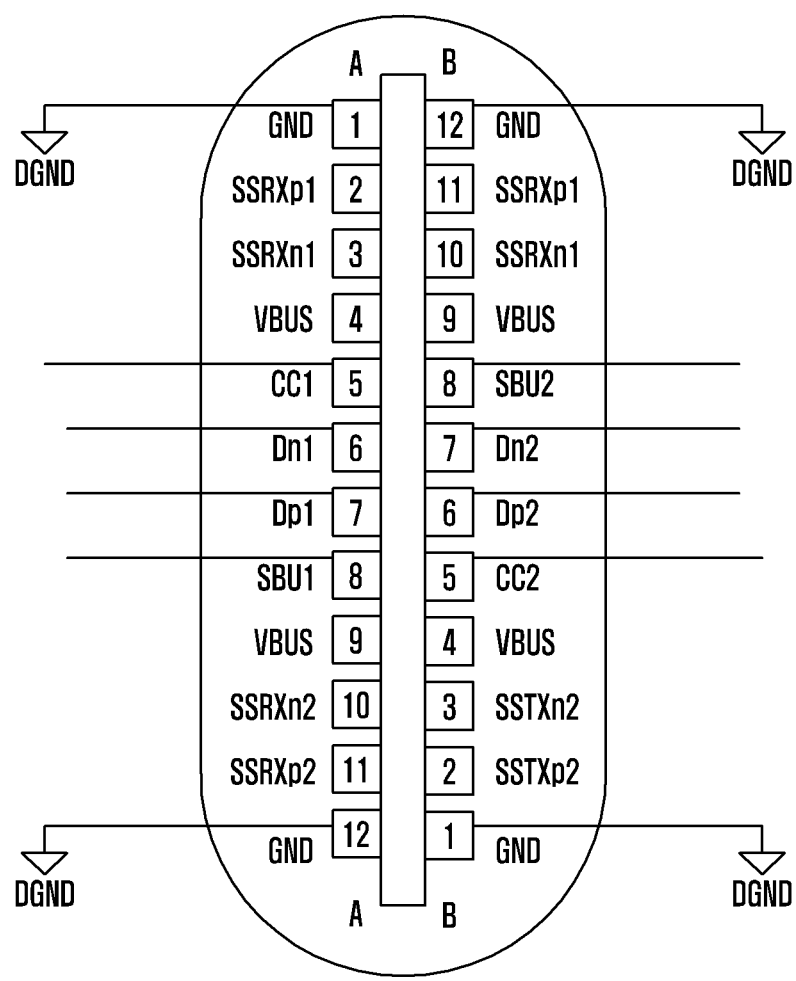
FIG. 5 illustrates a pin allocation structure of a connector of an electronic device according to various embodiments.

FIG. 5 illustrates a pin allocation structure of a connector of an electronic device according to various embodiments.

According to various embodiments, the connector of the electronic device conforms to the USB type C standard, and a plurality of terminals of the connector in accordance with the USB type C standard are shown in FIG. 5. As shown in FIG. 5, the USB type C standard connector may have twelve terminals on each of a left line A and a right line B, which may be symmetrical with each other.

Data signals may be transmitted through A6/B6 and A7/B7 terminals. In an audio accessory mode, a left audio signal (L) or a right audio signal (R) may be transmitted from the electronic device to the external device via the A6/B6 terminal (Dp1). Also, another one of the left audio signal (L) or the right audio signal (R) may be transmitted via the A7/B7 terminal (Dn1). Here, the L/R audio signals may be analog signals.

Side band unit (SBU) 1 and SBU 2 terminals do not have specified functions. However, in the audio accessory mode, these terminals may be used for purposes of microphone and ground. According to various embodiments, the microphone terminal or the ground terminal of the external device connector may be connected to the SBU 1 terminal of the line A and the SBU 2 terminal of the line B. For example, when the external device is inserted in the first direction, the microphone terminal of the external device may be connected to the SBU 1 terminal, and the ground terminal of the external device may be connected to the SBU 2 terminal. In contrast, when the external device is inserted in the second direction, the ground terminal of the external device may be connected to the SBU 1 terminal, and the microphone terminal of the external device may be connected to the SBU 2 terminal.

The functions of respective terminals in various operation modes are defined by the USB type C standard, so that a further description thereof will be omitted herein.

When the electronic device and the external device are connected, electrical signals (e.g., a digital ID or a resistor ID) are exchanged through CC1 and CC2 terminals. Therefore, each of the electronic device and the external device may detect the type of the connected device. Then, depending on the result of detecting the connected device, the electronic device may operate in a downstream facing port (DFP) mode or an upstream facing port mode (UFP).

According to various embodiments, when the resistance recognized in the CC1 and the CC2 is within a predetermined range, e.g., 800Ω to 1.2 kΩ, the electronic device and the external device may operate in the audio accessory mode. That is, when the external device is an audio accessory such as a headphone, an earphone, a speaker, or the like, it may be designed so that the range of 800Ω to 1.2 kΩ can be recognized through each of the CC1 and the CC2 at the time of connection to the electronic device.

According to various embodiments, the electronic device may determine a connection direction of the connector of the external device from the electrical signal recognized at the CC1 and CC2 terminals. The CC1 and CC2 terminals may be periodically toggled to H/L to define the recognition direction and function at the time of connection of the external device. In this case, a current sourcing scheme and a resistor pull-up scheme are defined to generate an H section.

According to various embodiments, each of the CC1 and CC2 terminals of the electronic device may be connected to one of the CC1 and CC2 terminals of the connector of the external device, and one of the CC1 and CC2 terminals of the connector of the external device may be connected to Vconn or a pull-down resistor. When the connector of the external device is connected to the connector of the electronic device, the electronic device may recognize a terminal of the external device connector connected to the CC1 and CC2 terminals thereof in a toggling manner. For example, when the CC1 terminal of the electronic device connector is connected to a pull-up resistor, and when it is determined through an electrical signal inputted to the CC1 terminal of the electronic device connector from the external device connector that a certain terminal of the external device connector is connected to a pull-down resistor, the electronic device may recognize this terminal as the CC1 terminal of the external device connector and also recognize the connection direction as the first direction. Similarly, when the CC2 terminal of the electronic device connector is connected to a pull-up resistor, and when it is determined through an electrical signal inputted to the CC2 terminal of the electronic device connector from the external device connector that a certain terminal of the external device connector is connected to a pull-down resistor, the electronic device may recognize this terminal as the CC1 terminal of the external device connector and also recognize the connection direction as the second direction. According to various embodiments, the connector of the external device may not be able to recognize the direction through such CC1 and CC2 terminals. In this case, the electronic device may recognize the connection direction of the external device by using the CC1 and CC2 terminals.

According to various embodiments, when operating in the audio accessory mode, the electronic device may detect impedance values from a first electrical path including a first terminal (e.g., SBU1 terminal) of the connector and from a second electrical path including a second terminal (e.g., SBU2 terminal). Then, based on the detected impedance values, the electronic device may determine the type of a terminal of the external device connected to the first and second terminals.

Hereinafter, a circuit configuration and processor operation for determining the type of each terminal of the connector of the external device electrically connected to at least a part (at least the first terminal and the second terminal) of respective terminals of the connector of the electronic device will be described in detail. Although the following description uses the connector of the USB type C standard, various embodiments of the disclosure may be also applied to electronic devices including other known connectors having a reversible structure.

Figure 6:
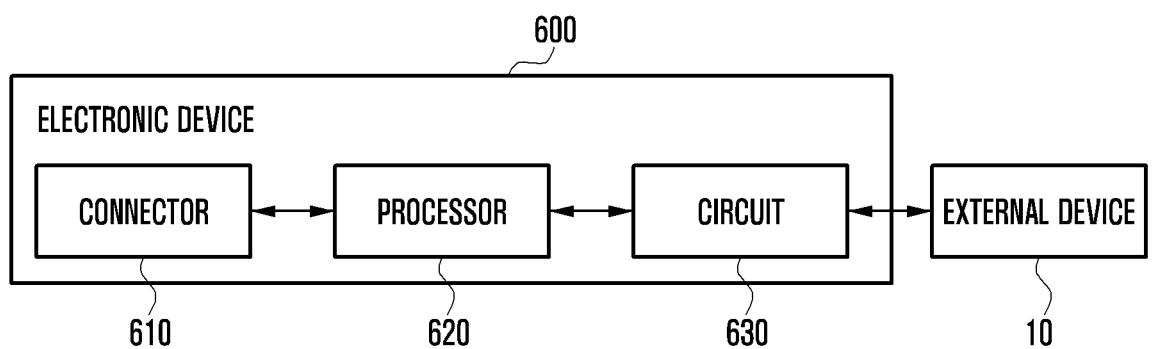
FIG. 6 is a block diagram of an electronic device according to various embodiments.

FIG. 6 is a block diagram of an electronic device according to various embodiments.

As shown in FIG. 6, the electronic device 600 according to various embodiments may include a connector 610, a processor 620, and a circuit 630. Here, the circuit 630 may refer to a circuit composed of several elements connected between the connector 610 and the processor 620. Even though some of components shown in FIG. 6 are omitted or substituted, various embodiments of the disclosure may be implemented.

The electronic device may include, at least in part, components and/or functions of the electronic device 101 of FIG. 1 and/or of the electronic device 201 of FIG. 2. For example, a display (e.g., the display 160 of FIG. 1 and/or the display 260 of FIG. 2), a memory (e.g., the memory 130 of FIG. 1 and/or the memory 230 of FIG. 2), various sensors (e.g., at least some of the sensor module 240 of FIG. 2), and the like may be further included.

According to various embodiments, the processor 620 is configured to perform operations or data processing on control and/or communication of each component of the electronic device 600. The processor 620 may include, at least in part, the processor 120 of FIG. 1 and/or the application processor 210 of FIG. 2. A memory (not shown) may store instructions, such as various arithmetic and logic operations, data transfer, input/output, and other control commands, performed by the processor 620, and operations of the processor 620 to be described later may be performed by loading the instructions stored in the memory.

The processor 620 may include a CODEC capable of, in the audio accessory mode, converting a digital sound signal into an analog signal and then transmitting the analog signal to the external device 10 through the connector 610, or converting an analog microphone signal inputted from the external device 10 into a digital signal.

According to various embodiments, the connector 610 includes a plurality of terminals and is configured to allow the connector of the external device 10 to be physically and/or electrically connected. The electronic device 600 includes an opening formed in one side of the housing (not shown) and a hole connected to the opening, and the connector 610 may be disposed inside the hole. The form and arrangement of the connector 610 and the connection form between the connector of the external device 10 and the connector 610 of the electronic device 600 have been described above with reference to FIGS. 3 and 4.

According to various embodiments, the connector 610 may be a USB type C connector. The terminal structure of the connector 610 based on the USB type C has been described above with reference to FIG. 5. When the connector 610 is formed of the USB type C connector, first and second terminals may denote SBU1 and SBU2 terminals, third and fourth terminals may denote CC1 and CC2 terminals, and fifth and sixth terminals may denote Dp and Dn terminals. Also, the first to sixth terminals may be referred to as including one or more terminals.

According to various embodiments, the circuit 630 includes various elements and may be electrically connected to at least parts (e.g., the first and second terminals) of the plurality of terminals of the connector 610. In addition, the circuit 630 may be electrically connected to the processor 620.

The connector of the external device 10 may include a terminal A used for transmission of a microphone signal and a terminal B used as the ground. According to an embodiment, the terminal B may be open, and the terminal A may be connected to the ground through a resistor. According to an embodiment, the terminal B may be connected to a device whose connector terminals are connected to nothing, and the terminal A may be, as the microphone terminal, connected to the ground through a resistor.

According to another embodiment, in the connector of the external device 10, both the terminal A and the terminal B may be, as the microphone terminals, connected to the ground via a resistor. Even in this case, according to an embodiment, the terminal B may be connected to a device whose connector terminals are connected to nothing, and the terminal A may be, as the microphone terminal, connected to the ground through a resistor. Also, both the terminal A and the terminal B may be connected to the ground via a resistor.

When the connector of the external device 10 is connected to the connector 610 of the electronic device 600 in the first direction, the terminal A may be connected to the first terminal of the electronic device 600, and the terminal B may be connected to the second terminal of the electronic device 600. Also, when the connector of the external device 10 is connected to the connector 610 of the electronic device 600 in the second direction, the terminal A may be connected to the second terminal of the electronic device 600, and the terminal B may be connected to the first terminal of the electronic device 600. That is, depending on a direction in which the connector of the external device 10 is connected, the terminals of the external device 10 electrically connected to the first and second terminals of the electronic device 600 may be varied. In order to transmit an audio signal to the external device 10 and receive a microphone signal, the electronic device 600 needs to recognize the types of terminals (e.g., a microphone terminal and a ground terminal) of the external device 10 electrically connected to the first and second terminals. Thus, the electronic device 600 may determine the terminal types of the external device 10 by detecting the connection direction of the external device 10.

According to various embodiments, the processor 620 may detect the connection direction of the external device 10 connected through the connector 610, based on an electrical signal inputted through at least one of the plurality of terminals of the connector 610. According to an embodiment, the processor 620 may detect the connection direction of the external device 10, based on an electrical signal inputted through the third terminal (e.g., the CC1 terminal) and the fourth terminal (e.g., the CC2 terminal) of the connector 610. When the connector of the external device 10 is connected to the connector 610 of the electronic device 600, the electronic device 600 may recognize connector terminals of the external device 10 connected to the third and fourth terminals in a toggling manner. For example, when the third terminal of the electronic device connector 610 is connected to a pull-up resistor, and when it is determined through an electrical signal inputted to the CC1 terminal of the electronic device connector 610 from the connector of the external device 10 that the third terminal (e.g., the CC1 terminal) of the external device connector is connected to a pull-down resistor, the electronic device 600 may recognize this terminal as the CC1 terminal of the connector of the external device 10 and also recognize the connection direction as the first direction. Similarly, when the fourth terminal of the electronic device connector 610 is connected to a pull-up resistor, and when it is determined through an electrical signal inputted to the CC1 terminal of the electronic device connector 610 from the connector of the external device 10 that a certain terminal of the connector of the external device 10 is connected to a pull-down resistor, the electronic device 600 may recognize this terminal as the CC1 terminal of the connector of the external device 10 and also recognize the connection direction as the second direction.

As such, based on the detected direction of the external device 10, the processor 620 may use one of the first terminal (e.g., the SBU1 terminal) and the second terminal (e.g., the SBU2 terminal) of the connector 610 as the microphone terminal and also use the other as the ground terminal. For this, the processor 620 may supply a bias voltage to one terminal, which is to be used as the microphone terminal, of the first and second terminals.

According to various embodiments, depending on the type of the external device 10, it may be impossible to recognize the direction of the external device 10 through the third and fourth terminals. That is, in order to determine the direction of the external device 10 by using the CC terminals as described above, it is required that the external device connector has corresponding circuit configuration. However, a certain external device manufactured by a third party may not have such circuit configuration. In this case, the electronic device 600 may detect the connection direction of the external device through impedance detection at the first terminal (e.g., the SBU1 terminal) and the second terminal (e.g., the SBU2 terminal).

According to various embodiments, the processor 620 may detect a first impedance of a first electrical path including the first terminal of the connector 610 and at least a part of the circuit 630, and may detect a second impedance of a second electrical path including the second terminal and at least another part of the circuit 630. Here, the first electrical path may include the first terminal, at least one inductor, a resistor, and a capacitor, and the second electrical path may include the second terminal, at least one inductor, a resistor, and a capacitor. In addition, the first electrical path and/or the second electrical path may further include at least one filter for removing noise from an audio signal and/or a microphone signal, and at least one analog-to-digital converter (ADC) for converting an analog signal into a digital signal.

As described above, when the first terminal or the second terminal is connected to the terminal A (e.g., the microphone terminal) of the connector of the external device 10, the connected first or second terminal may have a high impedance value by being connected to a resistor of the terminal A. In addition, when the first terminal or the second terminal is connected to the terminal B (e.g., the ground terminal) of the connector of the external device 10, the connected first or second terminal may have a relatively low impedance value by being connected to the terminal B being open.

When the first impedance belongs to the first range, the processor 620 may recognize that the terminal of the external device 10 electrically connected to the first terminal is the microphone terminal. When the first impedance belongs to the second range, the processor 620 may recognize that the terminal of the external device 10 electrically connected to the first terminal is the ground terminal. Also, when the second impedance belongs to the first range, the processor 620 may recognize that the terminal of the external device 10 electrically connected to the second terminal is the microphone terminal. When the second impedance belongs to the second range, the processor 620 may recognize that the terminal of the external device 10 electrically connected to the second terminal is the ground terminal. Here, the first range may be a value higher than the second range.

According to various embodiments, when the connection of the external device 10 is detected through the connector 610, the processor 620 may recognize an operation mode, based on an electrical signal inputted through the third terminal and the fourth terminal. When the signal recognized at the third and fourth terminals is Ra (within the range of 800Ω to 1.2 kΩ), the external device 10 may be recognized as an audio accessory (e.g., earphone, headphone, speaker). In the audio accessory mode, power may be supplied to the external device 10 through at least one terminal of the connector 610.

In case of operation in the audio accessory mode, the supply of a microphone bias (MIC_Vias) voltage may be required to receive a microphone signal of the external device 10. According to various embodiments, the circuit 630 is configured to supply the bias voltage to each of the first electrical path and the second electrical path. That is, under the control of the processor 620, the first bias voltage is supplied to the first electrical path, and the second bias voltage is supplied to the second electrical path. Here, the first bias voltage and the second bias voltage may be the same voltage value.

According to various embodiments, the processor 620 may be configured to detect the first impedance and the second impedance when the recognized operation mode at the time of connection of the external device 10 is the audio accessory mode. In addition, the processor 620 may control to supply the first bias voltage to the first electrical path and supply the second bias voltage to the second electrical path during the initial operation in the audio accessory mode. A current flows through the first and second electrical paths in accordance with the supply of the first and second bias voltages, so that the processor 620 may detect the impedance values of the first and second electrical paths.

According to various embodiments, when the terminal of the external device 10 electrically connected to the first terminal and/or the second terminal is recognized as the ground terminal, that is, when the first impedance value and/or the second impedance value belongs to the second range, the processor 620 may cut off the supply of the microphone bias voltage supplied to the electrical path including the corresponding terminal. In other words, the processor 620 may be configured to interrupt the supply of the first bias voltage when the ground terminal of the external device 10 is recognized as being electrically connected to the first terminal, and to interrupt the supply of the second bias voltage when the ground terminal of the external device 10 is recognized as being electrically connected to the second terminal. Because the microphone bias voltage is continuously supplied to the terminal recognized as being connected to the microphone terminal, the microphone signal of the external device 10 may be received through the corresponding terminal.

According to various embodiments, the processor 620 may transmit the audio signals (L, R) through the fifth and sixth terminals (e.g., the Dp and Dn terminals of the USB type C).

According to an embodiment, the first electrical path including the first terminal and the second electrical path including the second terminal may be disposed physically on the third electrical path including the third terminal and the fourth electrical path including the fourth terminal. This is to improve the audio performance of the third and fourth electrical paths, for example, crosstalk, signal-to-noise ratio (SNR), power supply ripple rejection ratio (PSRR), noise immunity, and the like.

Figure 7:
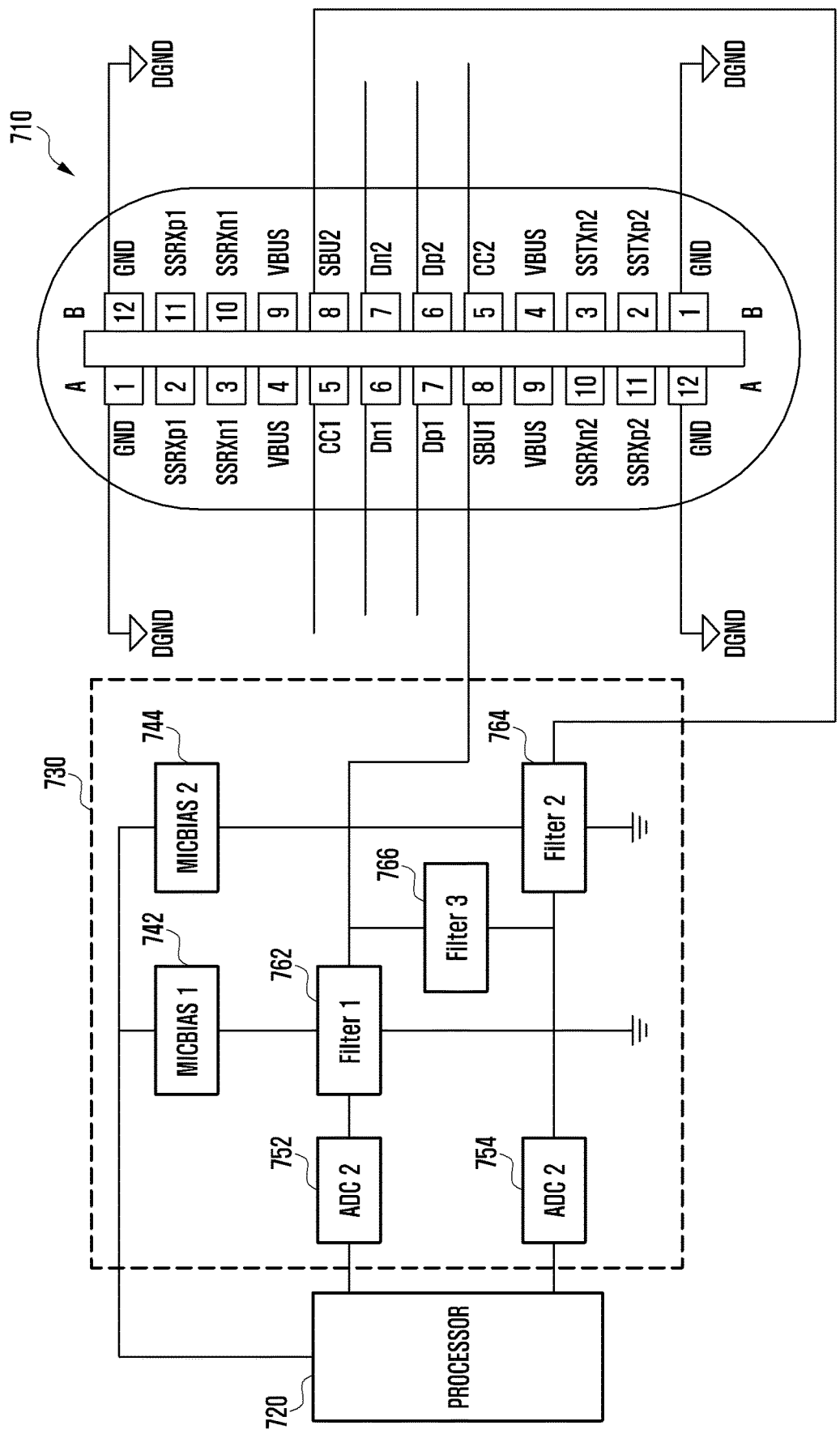
FIGS. 7, 8, and 9A are circuit diagrams of an electronic device according to various embodiments.
Figure 8:
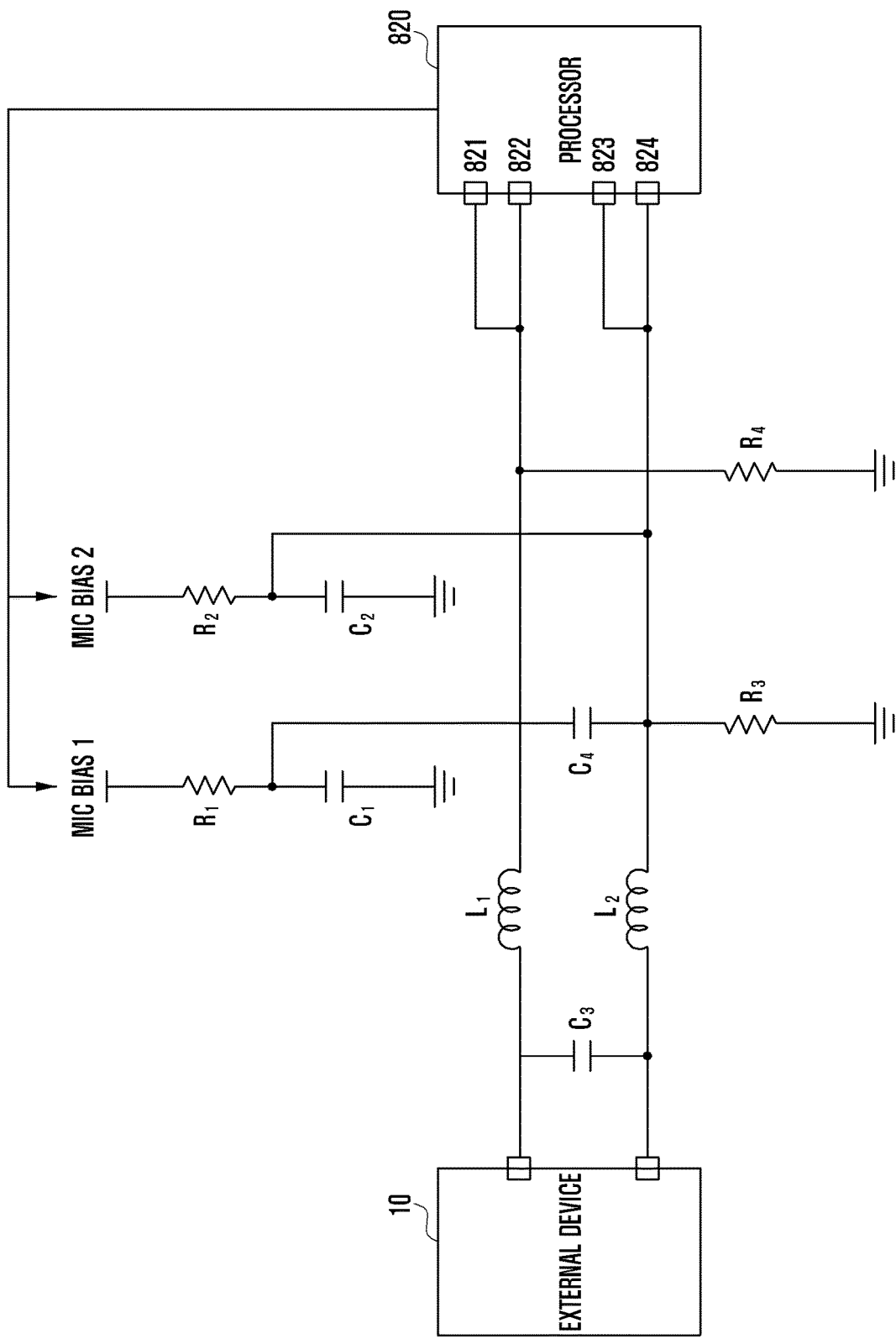

FIGS. 7 to 9 are circuit diagrams of an electronic device according to various embodiments.

As shown in FIG. 7, the electronic device 700 may include a connector 710, a processor 720, and a circuit 730 electrically disposed between the connector 710 and the processor 720.

The connector 710 includes a plurality of terminals. According to various embodiments, the connector 710 may be a USB type C connector. The pin allocation structure of the USB type C connector has been described above with reference to FIG. 5.

A first electrical path may be formed among one of terminals A and B of the external device, a first terminal (e.g., SBU1), and the processor 720 on the circuit 730. A second electrical path may be formed among the other of the terminals A and B of the external device, a second terminal (e.g., SBU2), and the processor 720.

According to various embodiments, a first ADC 752 may be provided on the first electrical path, and a second ADC 754 may be provided on the second electrical path. The first ADC 752 may convert a microphone signal received through the first terminal into a digital signal and transmit the digital signal to the processor 720. The second ADC 754 may convert a microphone signal received through the second terminal into a digital signal and transmit the digital signal to the processor 720. That is, the first ADC 752 and the second ADC 754 may not operate when the first terminal or the second terminal is connected to the ground terminal of the connector 710 of the external device. According to an embodiment, the first ADC 752 and the second ADC 754 may be provided within the processor 720. According to an embodiment, when a sound signal is inputted from the external device 10 to the first or second terminal connected to the microphone terminal, the first ADC 752 and the second ADC 754 may perform a function of converting the sound signal into a digital signal to be processable at the processor (or CODEC).

According to an embodiment, even in case of detecting the connection direction of the external device connector by using the electrical signals of the third and fourth terminals, the processor 720 may check the impedance of the first and second electrical paths and thereby determine whether the microphone terminal of the external device connector is actually connected to the first terminal and/or the second terminal.

According to various embodiments, a first filter 762 may be provided between the first ADC 752 and the first terminal, and a second filter 764 may be provided between the second ADC 754 and the second terminal. The first filter 762 and the second filter 764 may be provided to remove noise of a microphone signal which is an analog signal. The first filter 762 and the second filter 764 may be a known filter such as a band-pass filter for removing noise.

According to various embodiments, the circuit 730 may be configured to supply a first bias voltage to the first electrical path and supply a second bias voltage to the second electrical path. As described above, when operating in the audio accessory mode by the connection of the external device, the processor 720 may supply both the first bias voltage and the second bias voltage, and cut off the first and second bias voltages supplied to the first and/or second electrical path(s) including the terminal(s) detected as being connected to the ground terminal of the connector 710 of the external device.

FIG. 8 shows a more detailed circuit configuration.

The first terminal (e.g., SBU1) and the second terminal (e.g., SBU2) of the connector may be connected to the microphone terminal or the ground terminal of the connector of the external device 10. The first electrical path may be provided with an inductor L1, and the second electrical path may be provided with L2.

According to various embodiments, the first electrical path may be connected to a first bias voltage, which may be connected to a pull-up resistor R1 and connected to a ground through a capacitor C1. Similarly, the second electrical path may be connected to a second bias voltage, which may be connected to a pull-up resistor R2 and coupled to a ground through a capacitor C2. Also, a pull-down resistor R3 may be provided on the first electrical path, and a pull-down resistor R4 may be provided on the second electrical path. Capacitors C3 and C4 may be provided on the first and second electrical paths. The circuit configuration shown is merely an example, and may be varied in various forms.

According to various embodiments, the processor 820 may control to supply a microphone bias voltage to the first electrical path and/or the second electrical path. According to an embodiment, a switching element (not shown) may be further included for switching the microphone bias voltage to the first electrical path or the second electrical path.

According to various embodiments, the microphone signal inputted to the processor 820 via the first electrical path may be branched and inputted to two pins 821 and 822 of the processor. In this case, the electrical signal inputted to one pin 821 of the processor 820 may be inputted to the first ADC provided in the processor and inputted as a microphone signal to an audio system (e.g., CODEC). The electrical signal inputted to the other pin 822 may be used for detection of the first impedance. When the ground terminal of the connector of the external device 10 is connected to the first terminal, the microphone signal may not be inputted through the first terminal. The second electrical path may also be configured to correspond to the first electrical path so that the input microphone signal is branched and inputted to two pins 823 and 824 of the processor.

Figure 9A:
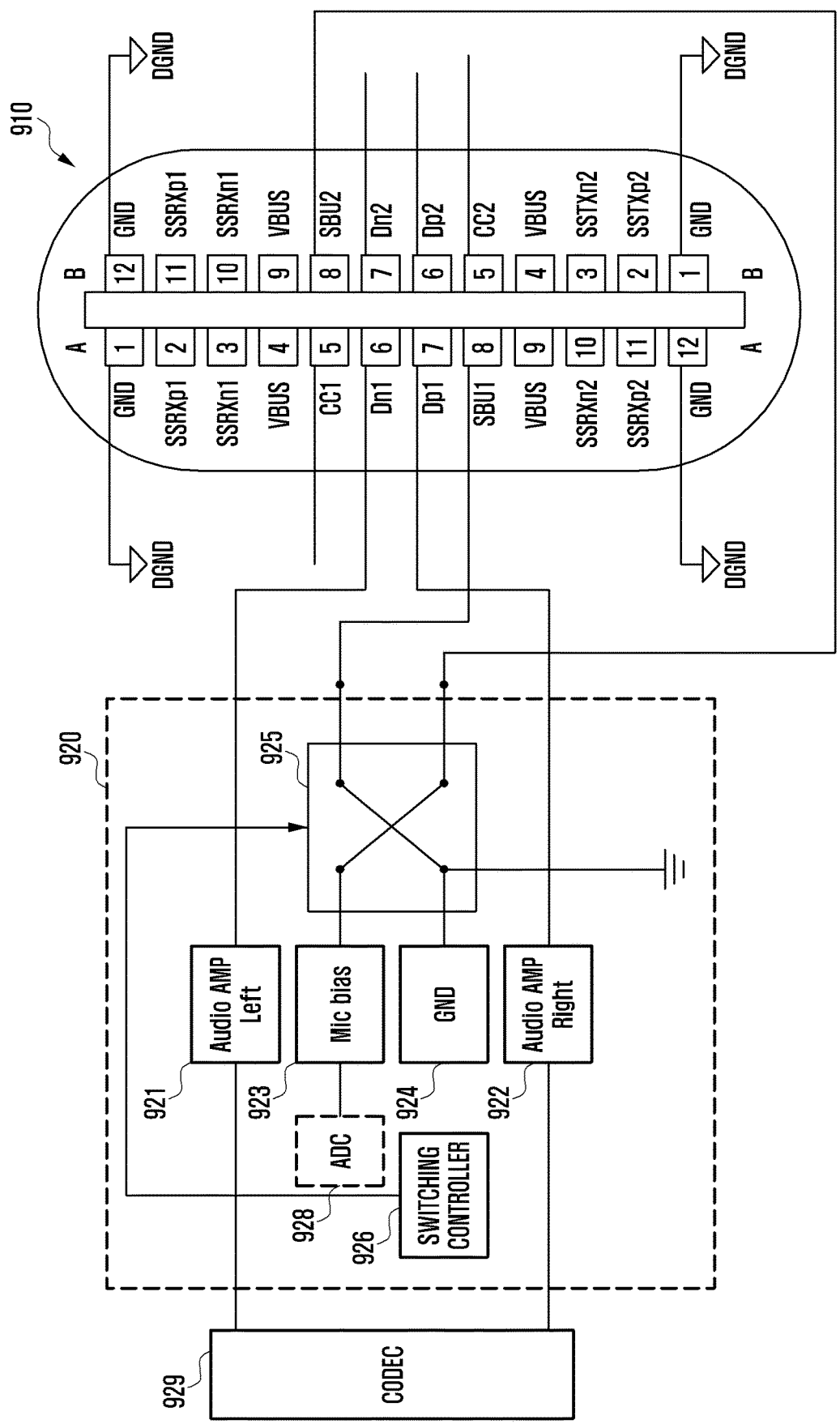

Referring to FIG. 9A, a processor 920 may include a first audio amplifier 921, a second audio amplifier 922, a microphone bias 923, a ground 924, a switch 925, a switching controller 926, an ADC 928, and a CODEC 929.

The first audio amplifier 921 (or audio amp left) amplifies an audio signal L, and the amplified audio signal L may be transmitted to the external device through a fifth terminal (e.g., Dp). The second audio amplifier 922 (or audio amp right) amplifies an audio signal R, and the amplified audio signal R may be transmitted to the external device through a sixth terminal (e.g., Dn). Each of the fifth and sixth terminals may be connected to one of terminals C and D of the connector of the external device. When the connector of the external device is connected in the first direction, the fifth terminal may be connected to the terminal C, and the sixth terminal may be connected to the terminal D. Therefore, the audio signal L may be transmitted to the terminal C, and the audio signal R may be transmitted to the terminal D. In contrast, when the connector of the external device is connected in the second direction, the audio signal L may be transmitted to the terminal D, and the audio signal R may be transmitted to the terminal C.

The switch 925 may switch the first electrical path including the first terminal and the second electrical path including the second terminal to the microphone bias 923 and the ground 924 under the control of the switching controller 926. For example, when it is detected through the impedance check that the first terminal is connected to the microphone terminal of the external device and the second terminal is connected to the ground terminal of the external device, the processor 920 may control the first electrical path to be connected to the microphone bias 923 and control the second electrical path to be connected to the ground 924. In contrast, when it is detected that the second terminal is connected to the microphone terminal of the external device and the first terminal is connected to the ground terminal of the external device, the processor 920 may control the second electrical path to be connected to the microphone bias 923 and control the first electrical path to be connected to the ground 924. The microphone signal inputted through connection of the ADC 928 and the microphone bias 923 may be inputted to the CODEC 929 after being converted into a digital signal by the ADC 928.

Here, the ground 924 may be used as a reference ground of the audio system. Also, the switch 925 and the switching controller 926 may be omitted when the audio system can internally process, by the microphone bias 923 and the ground 924, signals received via the first and second terminals, respectively.

Figure 9B:
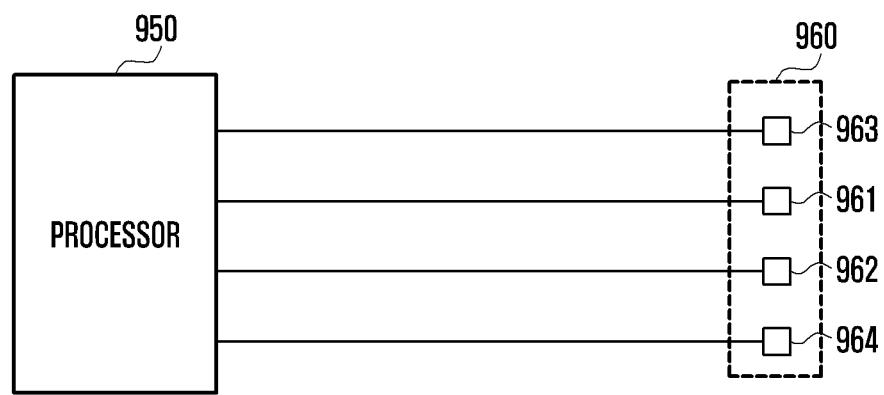
FIG. 9B illustrates a physical wiring structure of an electronic device according to various embodiments.

FIG. 9B illustrates a physical wiring structure of an electronic device according to various embodiments.

As shown in FIG. 9B, a first electrical path including a first terminal 961 and a second electrical path including a second terminal 962 may be physically disposed on a third electrical path including a fifth terminal 963 and a fourth electrical path including a sixth terminal 964. This is to improve audio performance of the third and fourth electrical paths, for example, crosstalk, signal-to-noise ratio (SNR), power supply ripple rejection ratio (PSRR), noise immunity, and the like, by physically disposing the third and fourth electrical paths at remote locations.

FIGS. 10 to 14 are circuit diagrams of an electronic device according to various embodiments.

Figure 10:
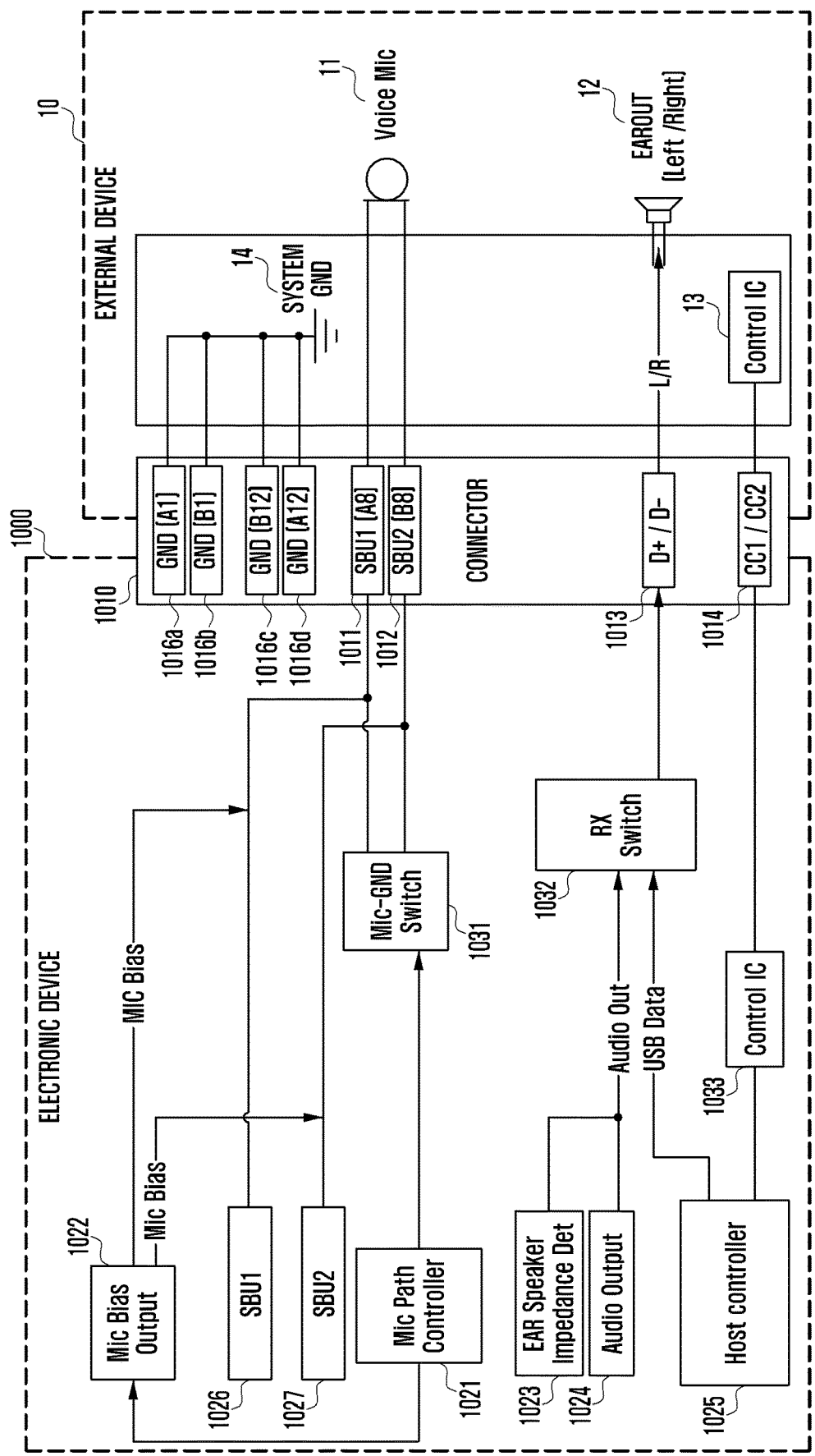
FIGS. 10, 11, 12, 13, and 14 are circuit diagrams of an electronic device according to various embodiments.

FIG. 10 shows an embodiment in which an external device includes one microphone.

According to various embodiments, the electronic device 1000 may include a connector 1010 that includes a plurality of pins and is electrically connected to a connector of the external device 10. The connector 1010 includes four ground terminals 1016a, 1016b, 1016c and 1016d which may be electrically connected to a system ground 14 of the external device 10 when the external device 10 is connected.

A microphone signal inputted through a microphone 11 of the external device 10 may be inputted to one of a first terminal 1011 (e.g., SBU1) and a second terminal 1012 (e.g., SBU2). As described above, to receive the microphone signal, the first terminal 1011 may be connected to the microphone terminal of the external device 10 when the connector of the external device 10 is connected to the connector 1010 of the electronic device 1000 in a first direction, and the second terminal 1012 may be connected to the microphone terminal of the external device 10 when the connector of the external device 10 is connected to the connector 1010 of the electronic device 1000 in a second direction.

When a terminal of the connector of the external device 10 connected to the first terminal 1111 and the second terminal 1112 is recognized as the microphone terminal and/or the ground terminal through the impedance check, a switching controller 1021 (or mic path controller) may control (switching) a switch 1031 (or mic-gnd switch) so that a first electrical path including the first terminal 1011 and a second electrical path including the second terminal 1012 are connected to SBUs 1026 and 1027, respectively, and a ground. The switch structure is as described above with reference to FIG. 9A.

A host controller 1025 may recognize an operation mode according to an electrical signal inputted through third and fourth terminals 1014 (e.g., CC1 and CC2) when the connection of the external device 10 is detected through the connector 1010. When the signal recognized at the third and fourth terminals 1013 is Ra (within the range of 800Ω to 1.2 k Ω), the host controller 1025 may recognize that the external device 10 is an audio accessory (e.g., an earphone, a headphone, a speaker). A control IC 1033 may be configured to process a control signal of the host controller 1025.

A processor may determine the connection direction of the external device connector according to the electrical signal inputted through the third and fourth terminals 1013. Then, through a microphone bias output unit 1022 (or mic bias output), the processor may supply a microphone bias voltage to the third terminal in case of a first connection direction and to the fourth terminal in case of a second connection direction.

In addition, when failing to determine the connection direction of the external device connector according to the electrical signal inputted through the third and fourth terminals 1013, the processor may supply the bias voltage to the first and second electrical paths through a microphone bias output unit 1022 (or mic bias output). Thereafter, when it is detected as a result of the detection by the impedance check that the ground terminal is connected to any one electrical path, the bias voltage provided to the electrical path may be interrupted.

USB data provided by the host controller 1025 and audio data outputted from an audio output unit 1024 (or audio output) may be transmitted to the external device 10 via an Rx switch 1032. The Rx switch 1032 may switch audio signals to be outputted through the fifth and sixth terminals 1013 (e.g., Dp/Dn) in the audio accessory mode. The audio signals L and R outputted from the electronic device 1000 may be outputted through L/R ear-out ends 12 of the external device 10.

Figure 11:
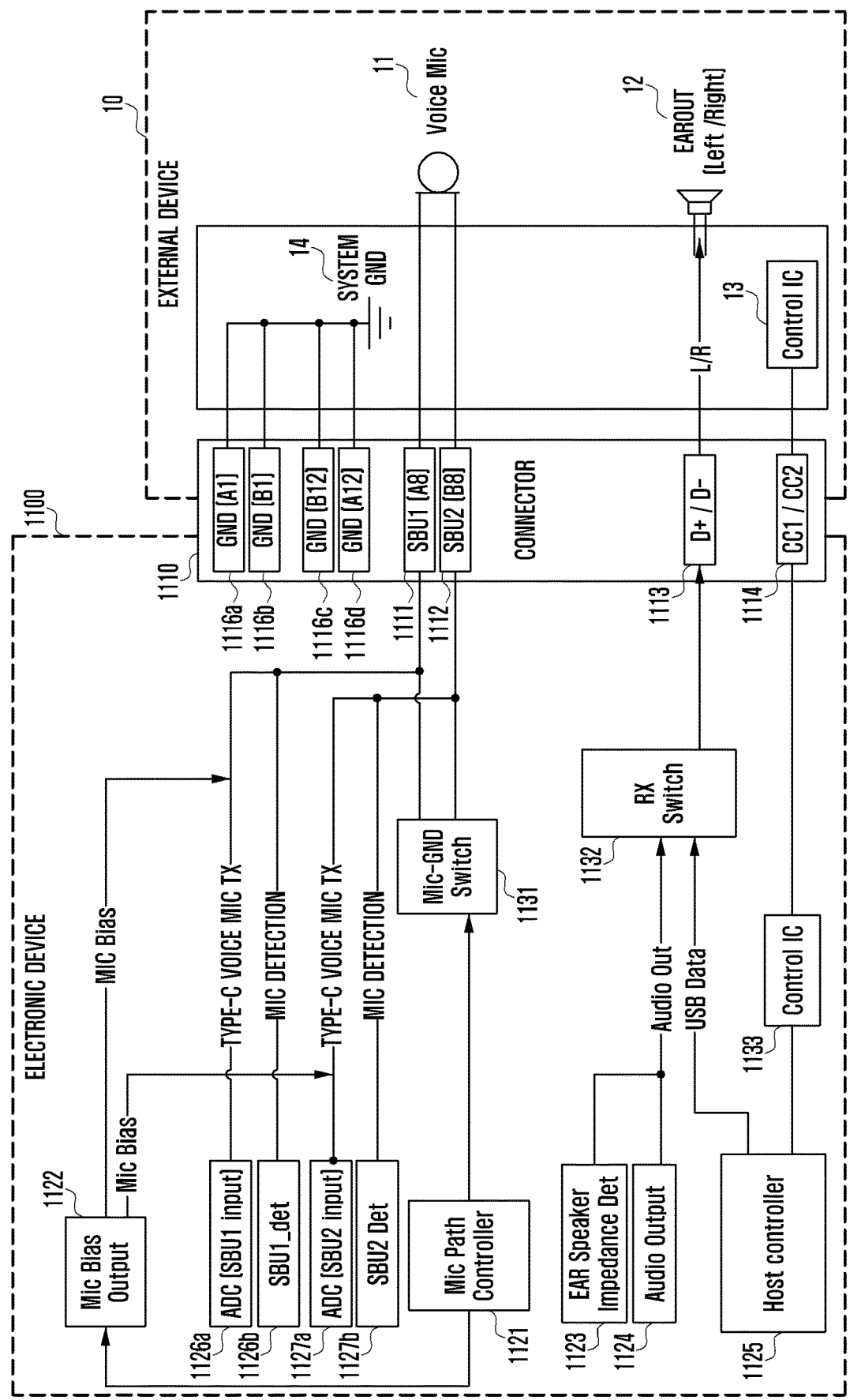

FIG. 11 shows another embodiment in which an external device includes one microphone.

An electronic device may further include a first ADC 1126a, a first detecting unit 1126b (or SBU1_det), a second ADC 1127a, and a second detecting unit 1127b (or SBU2_det).

When a first terminal 1111 is connected to the microphone terminal of the external device 10, the microphone signal may be inputted to the first ADC 1126a and the first detecting unit 1126b (or SBU1_det). The first detecting unit 1126b is configured to perform the first impedance check of the first electrical path, and the first ADC 1126a is configured to convert the microphone signal into a digital signal and provide the digital signal to an audio system (e.g., CODEC) of a processor. Similarly, when a second terminal 1112 is connected to the microphone terminal of the external device 10, the microphone signal may be inputted to the second ADC 1127a and the second detecting unit 1127b (or SBU2_det). The second detecting unit 1127b is configured to perform the second impedance check of the second electrical path, and the second ADC 1127a is configured to convert the microphone signal into a digital signal and provide the digital signal to the audio system. The first ADC 1126a, the first detecting unit 1126b, the second ADC 1127a, and the second detecting unit 1127b may be included in the processor (e.g., the processor 620 of FIG. 6 or the processor 820 of FIG. 8), and electrical signals may be inputted from four pins 821, 822, 823, and 824 of FIG. 8 to the above respective components within the processor.

When it is recognized through the impedance check that the terminal of the connector of the external device 10 connected to the first terminal 1111 and the second terminal 1112 is the microphone terminal and/or the ground terminal, a switching controller 1121 (or mic path controller) may control a switch 1131 (or mic-gnd switch) so that the first electrical path including the first terminal 1111 and the second electrical path including the second terminal 1112 are connected to the ADCs 1126a and 1127b, respectively, and the ground. The structure of the switch is as described with reference to FIG. 9.

Figure 12:
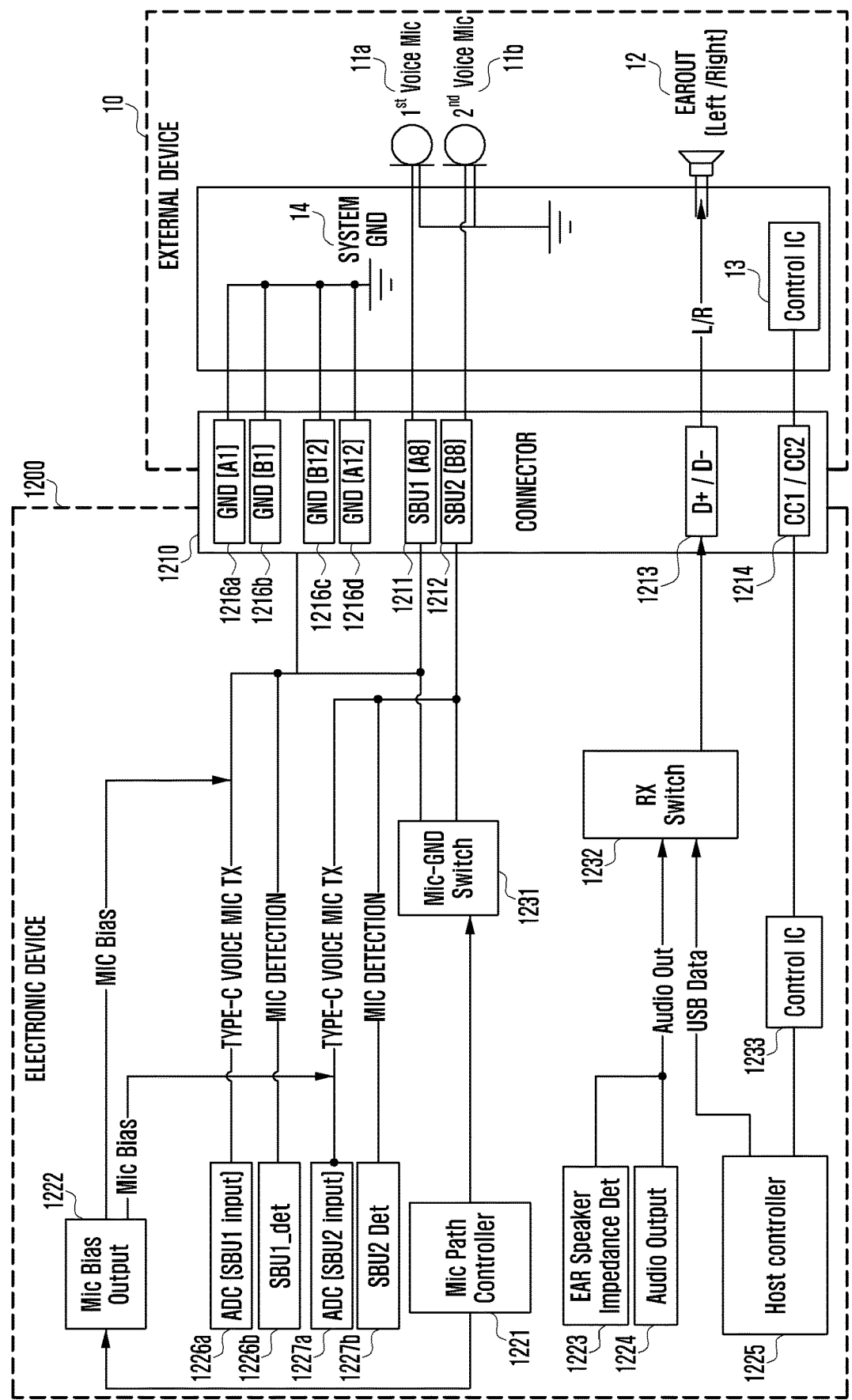

FIG. 12 relates to an embodiment in which an external device includes two microphones.

Referring to FIG. 12, the circuit configuration of an electronic device 1200 may be the same as that of the electronic device 1100 of FIG. 11. The external device 10 includes two microphones 11a and 11b to realize a high noise reduction and echo cancellation (NREC) performance and may provide a first microphone signal and a second microphone signal, generated at the first and second microphones 11a and 11b, to the electronic device 1200. When the external device 10 has two microphones 11a and 11b, the connector of the external device may have two microphone terminals.

According to various embodiments, a first terminal 1211 (e.g., SBU1) and a second terminal 1212 (SBU2) of a connector 1210 of the electronic device 1200 are both connected to an external device 10 can be connected to the microphone terminals of the connector. That is, the first terminal 1211 may be connected to the first microphone terminal of the external device 10, and the second terminal 1212 may be connected to the second microphone terminal of the external device.

According to an embodiment, a first impedance value of a first electrical path detected by a first detection unit 1226b and a second impedance value of a second electrical path detected by a second detection unit 1227b may be both detected within a first range, so that a processor may recognize that the microphone terminal of the external device 10 is connected to both the first terminal 1211 and the second terminal 1212. In this case, a microphone bias output unit 1222 may continuously provide a bias voltage to the first and second electrical paths until the external device 10 is disconnected. The processor may execute an NREC algorithm for output after noise reduction and echo cancellation, using the first and second microphone signals inputted through the first ADC 1226a and the second ADC 1226b.

According to an embodiment, because the first and second terminals 1211 and 1212 are used for the input of the microphone signals, the electronic device 1200 may control a switch 1231 to float a ground on a circuit thereof. In addition, a system ground 14 of the external device may be used for the ground of the first and second microphones 11a and 11b of the external device 10.

Figure 13:
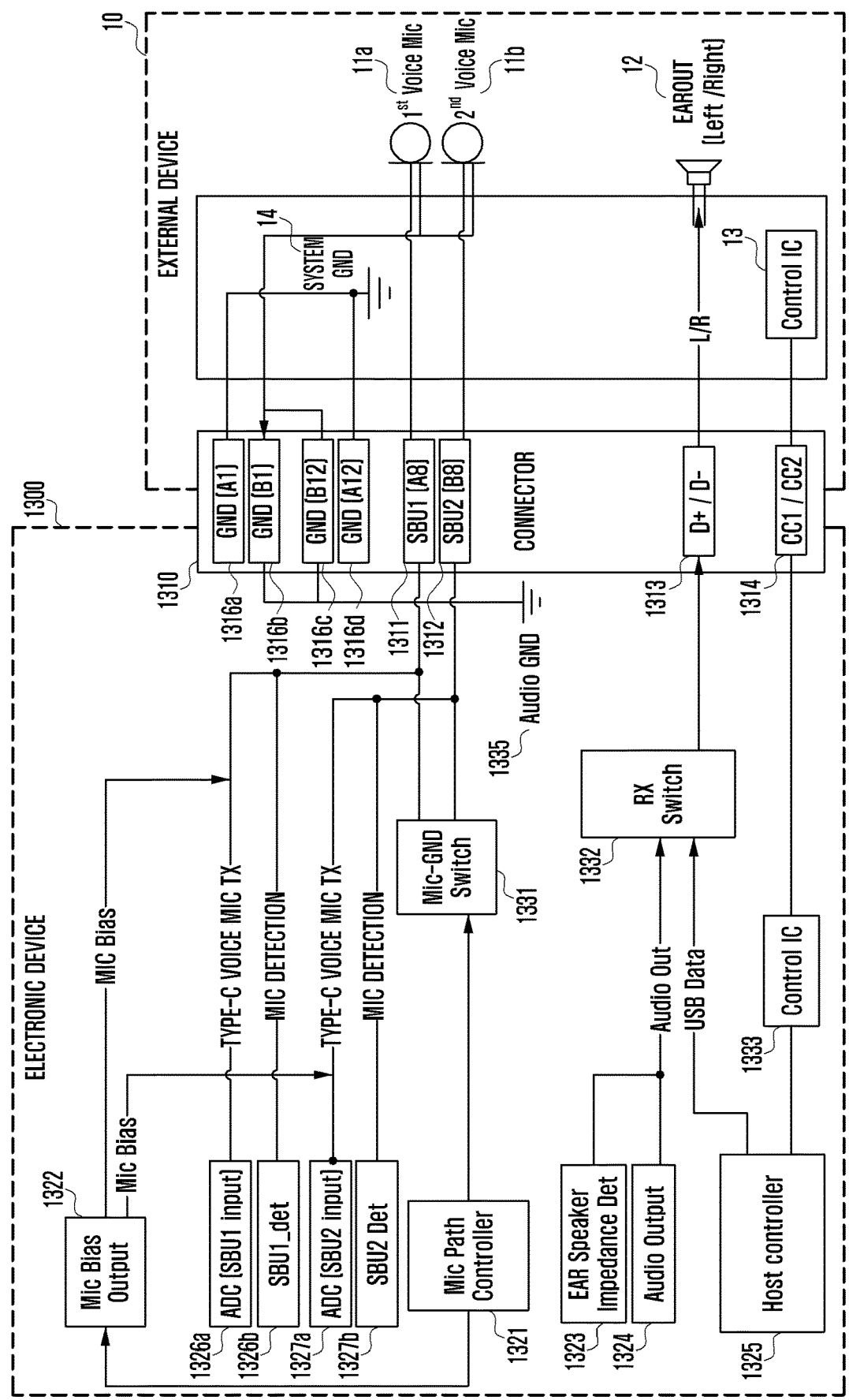

FIG. 13 relates to an embodiment in which an external device includes two microphones.

Compared to the embodiment of FIG. 12, an electronic device 1300 may further include an audio ground 1335. In case of the embodiment of FIG. 12, there is a possibility of deterioration of noise performance. According to an embodiment, in order to prevent such deterioration of noise performance, symmetrical two terminals (e.g., 1316a and 1316b or 1316c and 1316d) among four ground terminals 1316a, 1316b, 1316c and 1316d of a connector 1310 may be wired to separate from a system ground as shown in FIG. 13. In addition, the corresponding wire may be directly connected to the audio ground 1335 at a position closest to the connector 1310.

Figure 14:
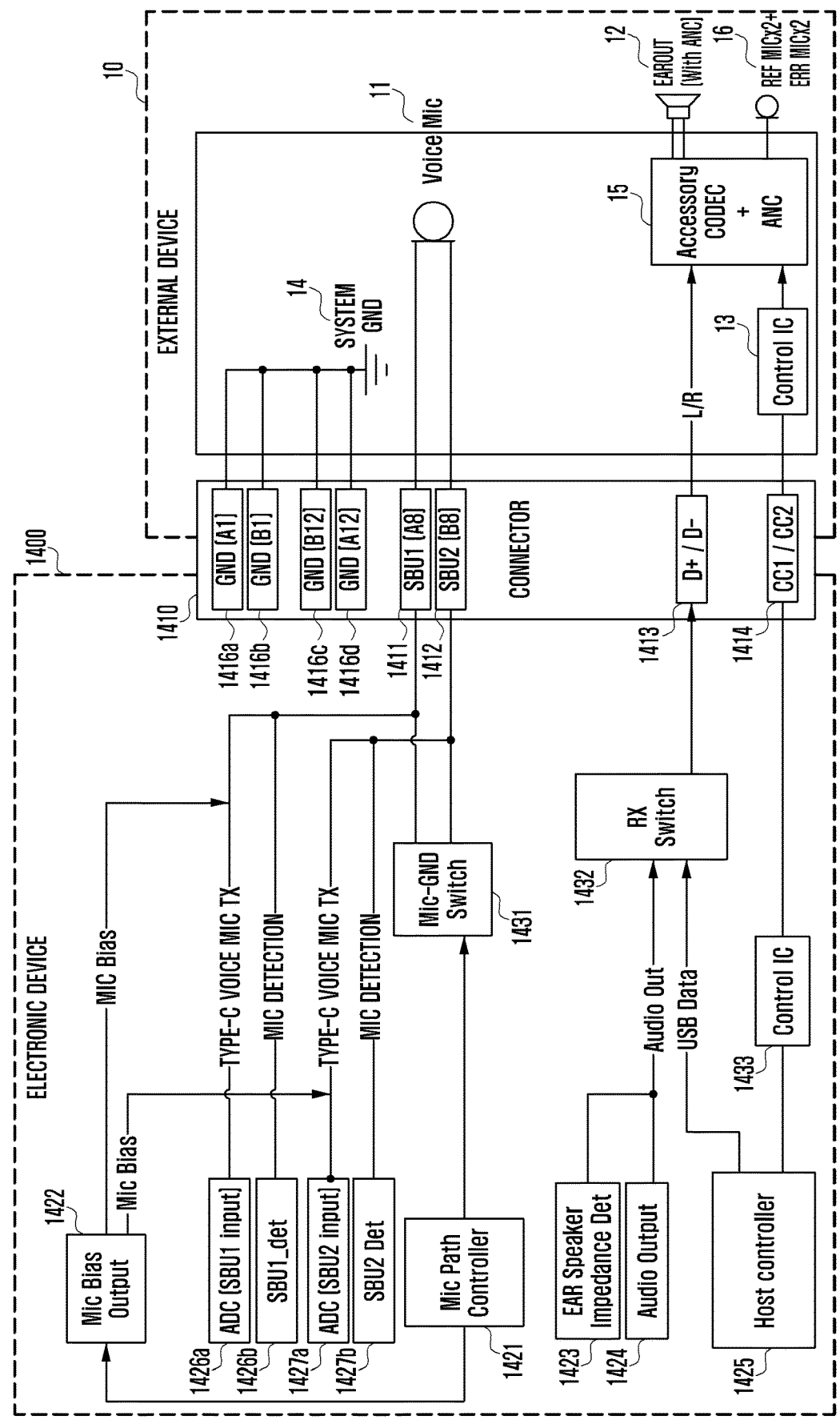

FIG. 14 relates to an embodiment in which an external device has an active noise canceling (ANC) function.

As shown in FIG. 14, the external device 10 includes an accessory CODEC 15 having the ANC function. The accessory CODEC may be connected to the L/R ear-out ends 12 and four digital microphones 16.

A host controller 1425 may detect that the external device 10 is an apparatus including the accessory CODEC 15 having the ANC function according to a signal inputted through fifth and sixth terminals 1414. Thus, a processor of an electronic device 1400 may enable the ANC function.

According to an embodiment, a digital microphone signal inputted from the four digital microphones 16 may be transmitted to the electronic device through fifth and sixth terminals 1413 of a connector 1410 of the electronic device 1400 after the ANC function and digital conversion at the CODEC 15. In addition, a microphone signal generated by at least one analog microphone 11 may be provided to the electronic device 1400 via a first terminal 1411 and/or a second terminal 1411 of the connector 1410 of the electronic device 1400 as in embodiments of FIGS. 11 to 13.

An electronic device according to various embodiments of the disclosure includes a connector including a plurality of terminals; a circuit electrically connected to at least parts of the plurality of terminals; and a processor electrically connected to the circuit. The processor may be configured to detect a connection direction of an external device connected through the connector, based on an electrical signal inputted through at least one terminal among the plurality of terminals of the connector, and to supply a microphone bias voltage to at least one, electrically connected to a microphone terminal of the external device, of first and second terminals of the connector, based on the detected direction of the external device.

According to various embodiments, the connector may further include a third terminal and a fourth terminal, and the processor may be further configured to detect the connection direction of the external device, based on an electrical signal inputted through the third and fourth terminals.

According to various embodiments, the processor may be further configured to detect a first impedance of a first electrical path including the first terminal, to detect a second impedance of a second electrical path including the second terminal, and to determine a type of a terminal of the external device electrically connected to the first terminal and the second terminal, based on the first impedance and the second impedance.

According to various embodiments, the processor may be further configured to detect the first impedance and the second impedance when failing to detect the connection direction of the external device in accordance with the electrical signal inputted through the third terminal and the fourth terminal.

According to various embodiments, the processor may be further configured to recognize the terminal of the external device electrically connected to the first terminal as a microphone terminal when the first impedance belongs to a first range, and recognize the terminal of the external device electrically connected to the first terminal as a ground terminal when the first impedance belongs to a second range, and to recognize the terminal of the external device electrically connected to the second terminal as the microphone terminal when the second impedance belongs to the first range, and recognize the terminal of the external device electrically connected to the second terminal as the ground terminal when the second impedance belongs to the second range.

According to various embodiments, the processor may be further configured to supply a first bias voltage to the first electrical path and supply a second bias voltage to the second electrical path when connection of the external device is detected.

According to various embodiments, the circuit further may include a first analog-to-digital converter (ADC) for converting a microphone signal into a digital signal and transmitting the digital signal to the processor when the microphone signal is inputted from the external device through the first terminal; and a second ADC for converting a microphone signal into a digital signal and transmitting the digital signal to the processor when the microphone signal is inputted from the external device through the second terminal.

According to various embodiments, the circuit may further include an ADC for converting a microphone signal inputted from the external device into a digital signal and transmitting the digital signal to the processor; a ground; and a switching element for switching an electrical signal transmitted from the first terminal and the second terminal to one of the ADC and the ground.

According to various embodiments, the connector may further include a fifth terminal and a sixth terminal, and the processor may be further configured to transmit an audio signal to the external device through the fifth terminal and the sixth terminal.

According to various embodiments, the first electrical path and the second electrical path may be disposed between a third electrical path including the processor and the fifth terminal and a fourth electrical path including the processor and the sixth terminal.

According to various embodiments, the connector may further include a third terminal and a fourth terminal, and the processor may be further configured to recognize an operation mode according to an electrical signal inputted through the third terminal and the fourth terminal, and to detect the first impedance and the second impedance when the recognized operation mode is an audio accessory mode.

According to various embodiments, the electronic device may further comprise a housing; and a hole connected to an opening formed in one side of the housing, and the connector may be disposed within the hole and may be formed symmetrically with respect to a first direction perpendicular to an insertion direction of the external device and a second direction opposite to the first direction.

According to various embodiments, the connector may be a USB type C connector.

Figure 15:
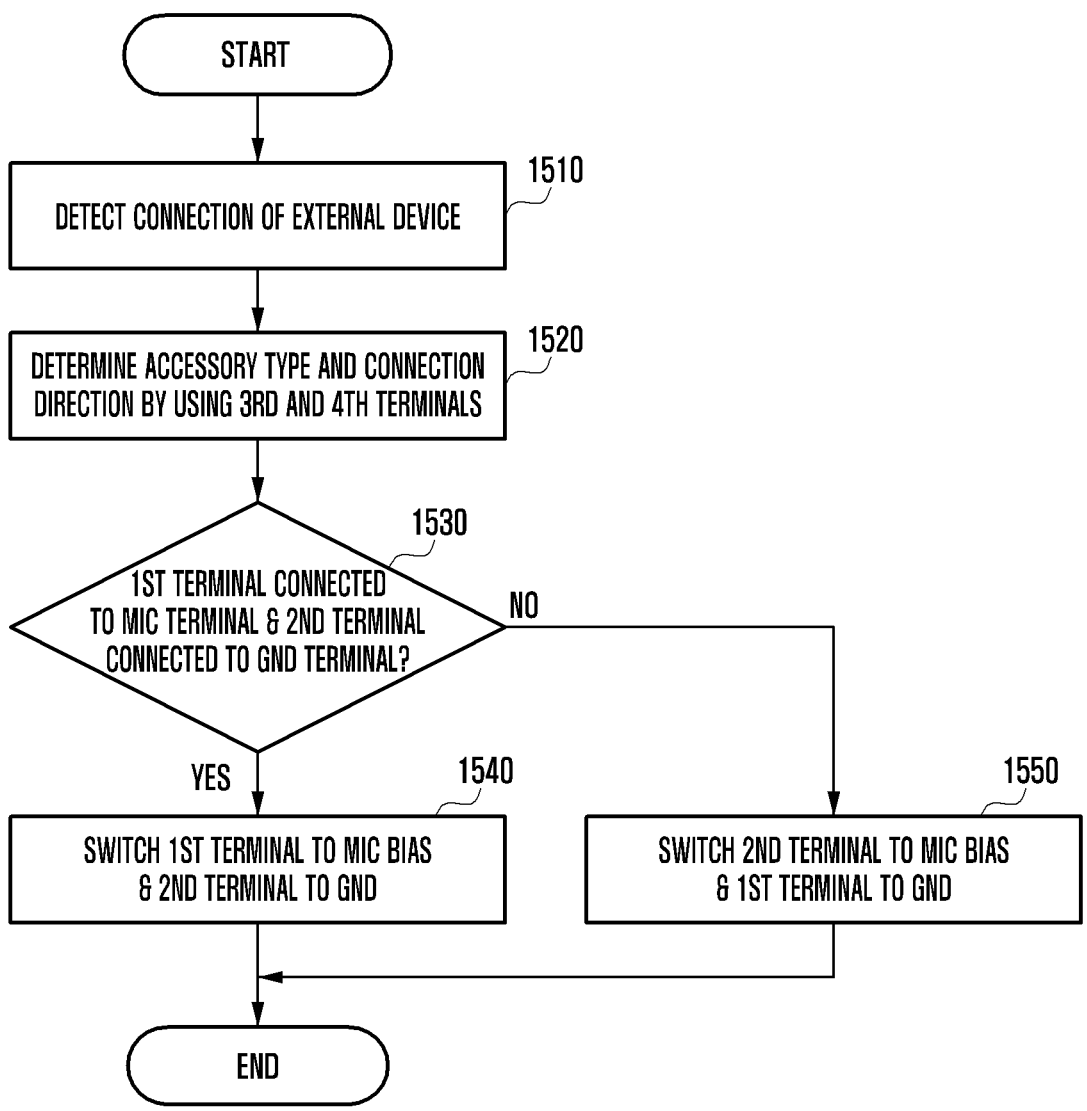
FIGS. 15 and 16 are flow diagrams of methods according to various embodiments in which an electronic device recognizes a connection terminal of an external device.
Figure 16:
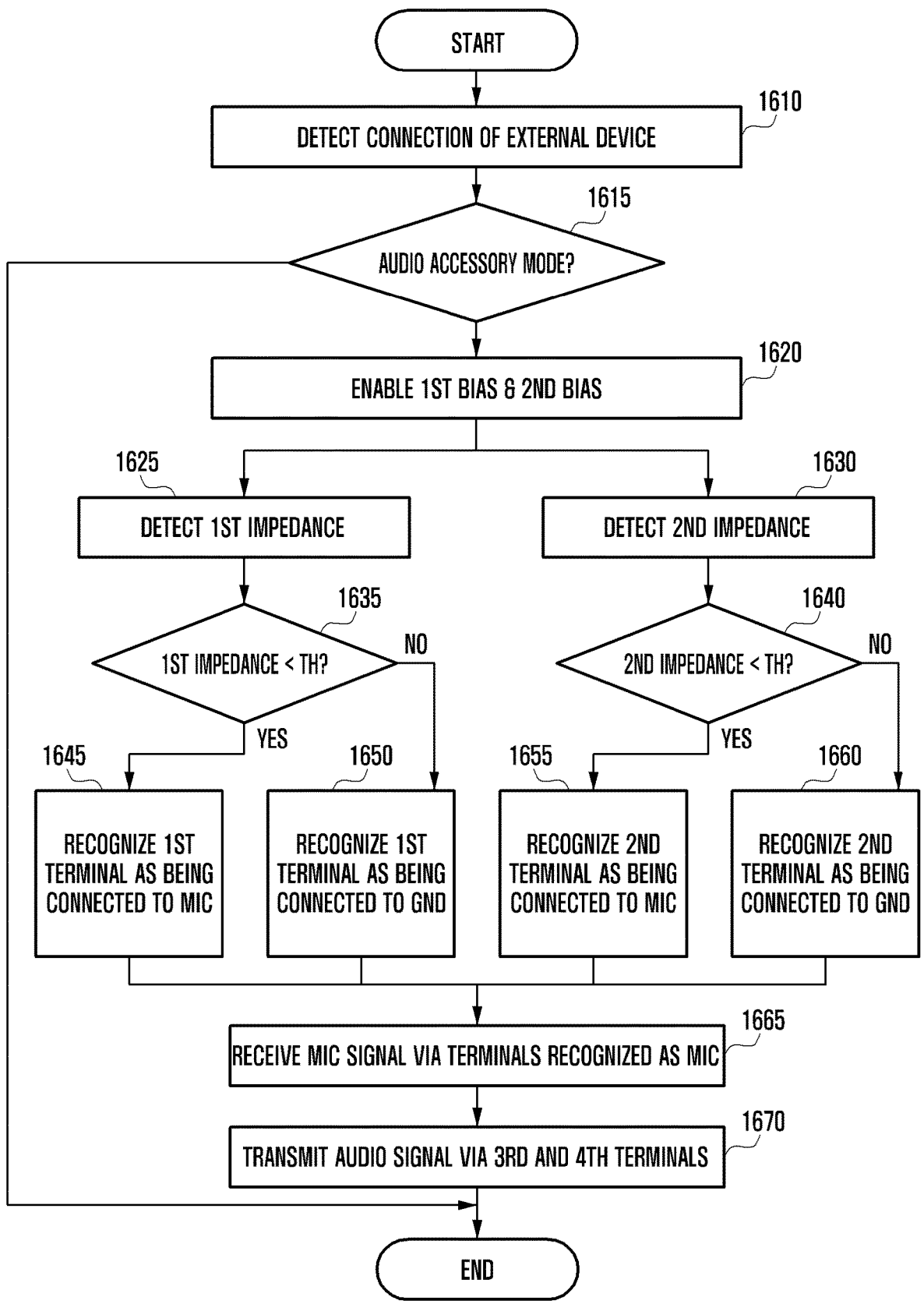

FIGS. 15 and 16 are flow diagrams of methods according to various embodiments in which an electronic device recognizes a connection terminal of an external device.

The methods shown in FIGS. 15 and 16 may be performed by the electronic device described above with reference to FIGS. 1 to 14. Hereinafter, the description about technical features described above will be omitted.

FIG. 15 relates to an embodiment for determining the connection direction of the external device connector in accordance with an electrical signal inputted to third and fourth terminals (e.g., CC1 and CC2 terminals).

At operation 1510, the electronic device may detect the connection of the external device via the connector. The connector includes a plurality of terminals, and an electrical signal may be detected through at least one of the plurality of terminals when the external device is connected. The connector of the electronic device may be a connector of USB type C, and a terminal structure of the connector in this case has been described with reference to FIG. 5. According to various embodiments, the connector of the external device may be inserted into the connector of the electronic device in a first direction and a second direction which are symmetrical to each other, as shown in FIGS. 3 and 4.

At operation 1520, the electronic device may determine the type and connection direction of the connected external device by using the third and fourth terminals. Here, the third terminal and the fourth terminal may be the CC1 and CC2 terminals of the USB type C. For example, when the third terminal of the electronic device connector is connected to a pull-up resistor, and when it is determined through an electrical signal inputted to the CC1 terminal of the electronic device connector from the connector of the external device that the third terminal (e.g., the CC1 terminal) of the external device connector is connected to a pull-down resistor, the electronic device may recognize this terminal as the CC1 terminal of the connector of the external device and also recognize the connection direction as the first direction. Similarly, when the fourth terminal of the electronic device connector is connected to a pull-up resistor, and when it is determined through an electrical signal inputted to the CC1 terminal of the electronic device connector from the connector of the external device that a certain terminal of the connector of the external device is connected to a pull-down resistor, the electronic device may recognize this terminal as the CC1 terminal of the connector of the external device and also recognize the connection direction as the second direction.

When it is determined at operation 1530 as a result of determination at operation 1520 that the external device is connected in the first direction, that is, the first terminal is connected to the microphone terminal of the external device connector and the second terminal is connected to the ground terminal of the external device connector, the electronic device may connect the first terminal to a microphone bias and switch the second terminal to a ground at operation 1540.

In contrast, when the external device is connected in the second direction, that is, when it is determined that the second terminal is connected to the microphone terminal of the external device connector and the first terminal is connected to the ground terminal of the external device connector, the electronic device may connect the second terminal to the microphone bias and switch the first terminal to the ground at operation 1550.

FIG. 16 shows an embodiment for determining the connection direction of the external device connector by using the impedance check of the first and second terminals when failing to determine the connection direction of the external device by using the third and fourth terminals.

At operation 1610, the electronic device may detect the connection of the external device connected through the connector.

At operation 1615, the electronic device may determine whether the recognized operation mode is the audio accessory mode. The audio accessory mode may refer to an operation mode when an audio accessory (e.g., an earphone, a headphone, a speaker, etc.) is connected to the electronic device. According to various embodiments, an electrical signal (e.g., a digital ID or a resistor ID) is exchanged between the electronic device and the external device via the third and fourth terminals (e.g., CC1 and CC2 terminals) of the connector, and thereby each of the electronic device and the external device can detect the type of the connected device.

At operation 1620, the electronic device may supply a first bias voltage to a first electrical path including the first terminal and supply a second bias voltage to a second electrical path including the second terminal. The first electrical path and the second electrical path have been described above in detail with reference to FIGS. 7 to 14.

At operation 1565, the electronic device may detect a first impedance of the first electrical path. Further, at operation 1630, the electronic device may detect a second impedance of the second electrical path. As described above, the connector of the external device includes a terminal A used for transmitting a microphone signal and a terminal B used as a ground, wherein the terminal B may be opened and the terminal A may be connected to the ground through a resistor. According to another embodiment, the terminals A and B of the connector of the external device may be both connected, as microphone terminals, to the ground via a resistor. When the external device is inserted in the first direction, the first terminal of the connector may be electrically connected to the microphone terminal of the external device, and when the external device is inserted in the second direction, the first terminal of the connector may be electrically connected to the ground terminal. Therefore, depending on the input direction of the external device, the microphone terminal or the ground terminal of the connector of the external device may be connected to the first terminal and the second terminal, respectively, and thereby the impedance value may be changed.

At operation 1635, the electronic device may determine whether the first impedance value is within the first range. According to an embodiment, the electronic device may determine that the first impedance value is within the first range when being higher than a predetermined threshold value and is within the second range when being equal to or lower than the threshold value. At operation 1640, the electronic device may determine whether the second impedance value is within the second range.

At operation 1640, when the first impedance value is within the first range, the electronic device may recognize that the first terminal is electrically connected to the microphone terminal of the connector of the external device. At operation 1650, when the first impedance value is within the second range, the electronic device may recognize that the first terminal is electrically connected to the ground terminal of the connector of the external device. At operation 1655, when the second impedance value is within the first range, the electronic device may recognize that the second terminal is electrically connected to the microphone terminal of the connector of the external device. At operation 1660, when the second impedance value is within the second range, the electronic device may recognize that the second terminal is electrically connected to the ground terminal of the connector of the external device.

At operation 1665, the electronic device may receive a microphone signal from the external device via the first and second terminals connected to the terminal recognized as the microphone.

At operation 1670, the electronic device may transmit an audio signal to the external device via the fifth and sixth terminals (e.g., Dp and Dn).

A method according to various embodiments of the disclosure, performed by an electronic device, for recognizing a connection terminal of an external device may include operations of detecting a connection of the external device connected through a connector including a plurality of terminals; detecting a connection direction of the external device connected through the connector, based on an electrical signal inputted through at least one terminal among the plurality of terminals of the connector; and supplying a microphone bias voltage to at least one, electrically connected to a microphone terminal of the external device, of first and second terminals of the connector, based on the detected direction of the external device.

According to various embodiments, the operation of detecting the connection direction of the external device may include an operation of detecting the connection direction of the external device, based on an electrical signal inputted through the third and fourth terminals.

According to various embodiments, the operation of detecting the connection direction of the external device may include operations of detecting a first impedance of a first electrical path including the first terminal; detecting a second impedance of a second electrical path including the second terminal; and determining a type of a terminal of the external device electrically connected to the first terminal and the second terminal, based on the first impedance and the second impedance.

According to various embodiments, the operations of detecting the first and second impedances may be performed when failing to detect the connection direction of the external device in accordance with the electrical signal inputted through the third and fourth terminals.

According to various embodiments, the operation of determining the type of the terminal of the external device may include operations of recognizing the terminal of the external device electrically connected to the first terminal as a microphone terminal when the first impedance belongs to a first range, and recognizing the terminal of the external device electrically connected to the first terminal as a ground terminal when the first impedance belongs to a second range, and recognizing the terminal of the external device electrically connected to the second terminal as the microphone terminal when the second impedance belongs to the first range, and recognizing the terminal of the external device electrically connected to the second terminal as the ground terminal when the second impedance belongs to the second range.

According to various embodiments, the method may further include an operation of supplying a first bias voltage to the first electrical path and supplying a second bias voltage to the second electrical path when connection of the external device is detected.

According to various embodiments, the connector may be a USB type C connector.

The invention claimed is:

1. An electronic device comprising:
a universal serial bus (USB) type C connector, including a plurality of terminals, and configured to be connected with a USB type C connector of an external device, wherein the plurality of terminals includes a first sideband use (SBU) terminal, a second SBU terminal, a first Configuration Channels (CC) terminal, and a second CC terminal;
a circuit electrically connected to at least parts of the plurality of terminals; and
a processor electrically connected to the circuit, wherein the processor in combination with the circuit are configured to:
detect impedance values on the first CC terminal and the second CC terminal,
if each of the impedance values detected on the first and second CC terminals is within a first predetermined range:
detect a first impedance value on the first SBU terminal using a first detecting unit electrically connected to the first SBU terminal, and
detect a second impedance value on the second SBU terminal using a second detecting unit electrically connected to the second SBU terminal, independent of the first detecting unit, wherein the first impedance value and the second impedance value are concurrently detectable using the first detecting unit and the second detecting unit, and
if a microphone of the external device is determined to be connected to the first SBU terminal based on the first impedance value detected on the first SBU terminal, supply a microphone bias voltage to the first SBU terminal to receive a microphone signal from the first SBU terminal and connect the second SBU terminal to a ground, and
if a microphone of the external device is determined to be connected to the second SBU terminal based on the second impedance value detected on the second SBU terminal, supply a microphone bias voltage to the second SBU terminal to receive a microphone signal from the second SBU terminal and connect the first SBU terminal to the ground.

2. The electronic device of claim 1, wherein the processor and circuit are further configured to input the received microphone signal to a CODEC.

3. The electronic device of claim 1, wherein the processor and circuit are further configured to:
determine that the first SBU terminal of the connector of the electronic device is connected to a microphone of the external device when the first impedance value detected on the first SBU terminal is within a first range,
determine that the first SBU terminal of the connector of the electronic device is connected to a ground of the external device when the first impedance value detected on the first SBU terminal is within a second range,
determine that the second SBU terminal of the connector of the electronic device is connected to the microphone of the external device when the second impedance value detected on the second SBU terminal is within the first range, and
determine that the second SBU terminal of the connector of the electronic device is connected to the ground of the external device when the second impedance value detected on the second SBU terminal is within the second range.

4. The electronic device of claim 1, wherein the circuit includes:
a first analog-to-digital converter (ADC) configured to convert the microphone signal into a digital signal and to transmit the digital signal to the processor when the microphone signal is received from the external device through the first SBU terminal of the connector of the electronic device, and
a second ADC configured to convert the microphone signal into a digital signal and to transmit the digital signal to the processor when the microphone signal is received from the external device through the second SBU terminal of the connector of the electronic device.

5. The electronic device of claim 1,
wherein the connector of the electronic device further includes a first D+ terminal, a first terminal D− terminal, a second D+ terminal, and a second D− terminal, and
wherein the processor and the circuit are further configured to transmit an audio signal to the external device through the first D+ and D− terminals or through the second D+ and D− terminals.

6. The electronic device of claim 5,
wherein the circuit further comprises a switch for connecting a CODEC to the D+ and D− terminals or connecting a USB host controller to the D+ and D− terminals, and
wherein the processor and the circuit are further configured to control the switch to connect the CODEC to the D+ and D− terminals if the impedance values detected on the first and second CC terminals are within the first predetermined range.

7. The electronic device of claim 1, further comprising:
a housing; and
a hole connected to an opening formed in one side of the housing,
wherein the connector of the electronic device is disposed within the hole, and
wherein the connector of the electronic device is formed symmetrically with respect to a first direction perpendicular to an insertion direction of the connector of the external device and a second direction opposite to the first direction.

8. The electronic device of claim 1, further comprising a switch for switching between connecting the first SBU terminal to the ground and the second SBU terminal to the ground under the control of the processor.

9. The electronic device of claim 1, further comprising a microphone-ground switch for switching between connecting the first SBU terminal and the second SBU terminal to the microphone bias or the ground under the control of the processor.

10. The electronic device of claim 1, wherein the processor and the circuit are further configured to:
connect the first SBU terminal or the second SBU terminal to the ground of the circuit.

11. A method performed by an electronic device including a universal serial bus (USB) type C connector, including a plurality of terminals, and configured to be connected with a USB type C connector of an external device, wherein the plurality of terminals includes a first sideband use (SBU) terminal, a second SBU terminal, a first Configuration Channels (CC) terminal, and a second CC terminal, the method comprising:
detecting impedance values on the first CC terminal and the second CC terminal;
in case that each of the impedance values detected on the first and second CC terminals is within a first predetermined range:
detecting, using a first detecting unit electrically connected to the first SBU terminal, a first impedance value on the first SBU terminal, and
detecting, using a second detecting unit electrically connected to the second SBU terminal, a second impedance value on the second SBU terminal independent of the first detecting unit, wherein the first impedance value and the second impedance value are concurrently detectable using the first detecting unit and the second detecting unit; and
in case that a microphone of the external device is determined to be connected to the first SBU terminal based on the first impedance value detected on the first SBU terminal, supplying a microphone bias voltage to the first SBU terminal to receive a microphone signal from the first SBU terminal and connecting the second SBU terminal to a ground, and
in case that a microphone of the external device is determined to be connected to the second SBU terminal based on the second impedance value detected on the second SBU terminal, supplying a microphone bias voltage to the second SBU terminal to receive a microphone signal from the second SBU terminal and connecting the first SBU terminal to the ground.

* * * * *